(12) United States Patent
Park et al.

(10) Patent No.: US 10,428,415 B2
(45) Date of Patent: Oct. 1, 2019

(54) METHOD OF MANUFACTURING SHADOW MASK USING HYBRID PROCESSING AND SHADOW MASK MANUFACTURED THEREBY

(71) Applicant: AP SYSTEMS INC., Gyeonggi-do (KR)

(72) Inventors: Jong-Kab Park, Gyenggi-do (KR); Bo-Ram Kim, Gyeonggi-do (KR); Jun-Gyu Hur, Busan (KR); Doh-Hoon Kim, Seoul (KR)

(73) Assignee: AP SYSTEMS INC. (KR)

( * ) Notice: Subject to any disclaimer, the term of this patent is extended or adjusted under 35 U.S.C. 154(b) by 0 days.

(21) Appl. No.: 15/743,944

(22) PCT Filed: Aug. 4, 2016

(86) PCT No.: PCT/KR2016/008598
§ 371 (c)(1),
(2) Date: Jan. 11, 2018

(87) PCT Pub. No.: WO2017/026741
PCT Pub. Date: Feb. 16, 2017

(65) Prior Publication Data
US 2018/0202035 A1 Jul. 19, 2018

(30) Foreign Application Priority Data
Aug. 10, 2015 (KR) .......................... 10-2015-0112608

(51) Int. Cl.
*C23C 14/04* (2006.01)
*H01L 21/027* (2006.01)
(Continued)

(52) U.S. Cl.
CPC .......... *C23C 14/042* (2013.01); *B23K 26/352* (2015.10); *G03F 7/0957* (2013.01);
(Continued)

(58) Field of Classification Search
None
See application file for complete search history.

(56) References Cited

U.S. PATENT DOCUMENTS

| | | | |
|---|---|---|---|
| 2002/0111035 A1* | 8/2002 | Atobe | C23C 14/042 438/753 |
| 2014/0238963 A1* | 8/2014 | Jo | B23K 26/127 219/121.77 |
| 2015/0068455 A1* | 3/2015 | Lee | B05C 21/005 118/504 |

FOREIGN PATENT DOCUMENTS

| | | |
|---|---|---|
| JP | 06179088 A | 6/1994 |
| KR | 1020000029265 A | 5/2000 |

(Continued)

OTHER PUBLICATIONS

International Search Report: dated Nov. 24, 2016 for PCT Application No. PCT/KR2016/008598.

*Primary Examiner* — Stephanie P Duclair
(74) *Attorney, Agent, or Firm* — Mendelsohn Dunleavy, P.C.

(57) ABSTRACT

The present invention discloses a method of manufacturing a shadow mask, wherein hybrid processing is used to form a mask pattern on the shadow mask, the method includes: forming a wet-etched pattern by performing wet etching from above a base; and forming a laser-processed pattern that continues from the wet-etched pattern, by performing laser processing from above the base or from below the base on which the wet-etched pattern is formed. The present invention uses hybrid processing including wet etching and laser processing for manufacturing a shadow mask. The method has an effect on solving the productivity degradation of the conventional laser processing and provides a shadow mask with high quality using wet etching.

16 Claims, 18 Drawing Sheets

(51) Int. Cl.
*H01L 21/033* (2006.01)
*G03F 7/095* (2006.01)
*G03F 7/12* (2006.01)
*B23K 26/352* (2014.01)
*H01L 21/31* (2006.01)
*H01L 51/00* (2006.01)

(52) U.S. Cl.
CPC .............. *G03F 7/12* (2013.01); *H01L 21/027* (2013.01); *H01L 21/0338* (2013.01); *H01L 21/31* (2013.01); *H01L 51/0011* (2013.01); *Y10S 148/143* (2013.01)

(56) References Cited

FOREIGN PATENT DOCUMENTS

| KR | 20050083421 | * | 8/2005 |
| KR | 1020050083421 A | | 8/2005 |
| KR | 1020100073734 A | | 7/2010 |
| KR | 1020140105239 A | | 9/2014 |

* cited by examiner

A : PR width
B : width
D : depth

E=(B−A/2) ---------------- formula(1)
Etch factor = D/E ---------------- formula(2)

→ B=2D/ Etch factor + A ---------------- formula(3)

Ex) 50=2*15/1.0+A
    A=20 wet etching (upper surface)

laser processing (lower surface)

(a)

(b)

(a)

(b)

OVERLAPPING OF LASER
BEAMS ON EACH SCAN PATH

SECTION OF THREE
DIMENSIONAL STRUCTURE

METHOD OF MANUFACTURING SHADOW MASK USING HYBRID PROCESSING AND SHADOW MASK MANUFACTURED THEREBY

TECHNICAL FIELD

The present invention relates generally to a method of manufacturing a metal shadow mask and a shadow mask manufactured by the method. More particularly, the present invention relates to a method of manufacturing a metal shadow mask, wherein hybrid processing including wet etching and laser processing is used to form a mask pattern including a wet-etched pattern and a laser-processed pattern on the shadow mask, and a shadow mask manufactured by the method.

BACKGROUND ART

Metal masks are generally used for a vacuum deposition process while manufacturing an organic electroluminescence (EL) device, an organic semiconductor element, etc.

Such metal masks have a three dimensional (3D) structure that has a plurality of circular holes or tapered structures. Semiconductor elements such as organic EL devices are manufactured by arranging the metal mask on a substrate and depositing a luminescence layer of a desired pattern to a specific area of the substrate.

U.S. Pat. Nos. 5,348,825 and 5,552,662 disclose conventional wet etching methods used to manufacture a metal mask, the methods include a chemical wet etching method of manufacturing a shadow mask. The shadow mask that is applied in present industrial sites is the chemical wet etching type.

A brief explanation of conventional wet etching is described below with reference to FIG. 1.

1. Resist coating: coating a photoresist 2 on both sides of a metal film 1.
2. Pattern coating: performing an exposure process on the photoresist 2 by using a glass mask pattern 3 (or quartz mask).
3. Developing: after the glass mask pattern 3 (or quartz mask) transcription on an upper surface of the photoresist 2, removing the glass mask 3 used for forming the pattern and selectively removing the photoresist 2 by performing a development process.
4. First etching: performing wet etching on the upper surface of the photoresist 2, in which the pattern is formed, to remove a part of a metal film 1 whereby the photoresist 2 is removed (aperture of the photoresist 2) by using an etching solution.
5. Filling: filling an anti-etching packing material in the upper surface of the metal film 1 in which the part thereof is removed. The anti-etching packing material is filled to protect a shape of the upper surface of the metal mask formed by the first etching while performing etching to a lower surface of the metal film 1.
6. Second etching: etching the lower surface of the metal film 1.
7. Removing: removing the anti-etching packing material and the photoresist, and finally obtaining the metal shadow mask.

The above process lists a typical process of manufacturing the metal shadow mask by using wet etching, and various modifications are developed from the above process. For example, the step "5. Filling" may be skipped, or both sides of the metal film are etched at the same time. However, the metal mask is generally manufactured by using the technique of chemical wet etching described in FIG. 1.

Wet etching has an isotropic characteristic as shown in FIG. 2. In other words, the metal film is removed while the metal film is identically affected by the etching solution in all directions from the aperture of the photoresist. Thus, a cross sectional shape of the metal film is formed to have a semicircle shape, as shown in FIG. 3. Thus, the metal mask that is finally formed on the metal film includes an aperture in which peripheries of the aperture (see the encircled portion in the drawing) are very thin.

Thus, the thinness of peripheries of the aperture may have a bad effect on precisely and stably securing a size or shape of the aperture.

For this reason, wet etching of the metal mask is not generally performed on one side (upper surface or lower surface) of the metal film, but performed on both sides of the metal film as shown in FIG. 3. Wet etching is performed on both sides of the metal film by using various methods that are disclosed in U.S. Pat. Nos. 5,348,825, 5,552,662, etc.

A cross line (cross point in a cross sectional view), in which a mask formed on the upper surface and a mask formed on the lower surface intersect to each other, is formed by using conventional methods. In addition, the metal mask including a taper structure (32 in FIG. 3) with a small size may be implemented by performing wet etching with a weak strength on any one side of the metal mask. Size and shape of the aperture may be secured by using such a taper structure. For this reason, heights of undercut (t in FIG. 3) are claimed to be 30~40% of the entire thickness T of the metal mask in the prior art.

However, such a taper structure is formed by the isotropic characteristic of wet etching, thus it may be formed to have the undercut shape.

The metal mask having such an undercut shape shows its limit when depositing an electroluminescence material to a substrate of display devices by using such a metal mask. When depositing the electroluminescence material through the aperture of the metal mask, the electroluminescence material is not uniformly deposited on the substrate due to the undercut shape.

In other words, the undercut shape causes a gradual deposition of the electroluminescence material on a position of the substrate corresponding to the undercut shape. As a result, a performance degradation of the display device occurs when manufacturing by using such a metal mask.

Meanwhile, it is known that at present wet etching may be applied up to 300 ppi (pixel per inch). However, it is difficult to use conventional wet etching methods to produce display devices having resolutions of QHD (approximately 500 ppi) or UHD (approximately 800 ppi).

FIG. 4 is a view of explaining an isotropic shape of conventional wet etching (formulas of (1), (2), and (3) show correlations between factors of the shape (A, B, D, E, T, pitch, and Etch factor)), and through interaction formulas between factors of the shape.

The limit of implementing high resolutions of display devices when using wet etching can be explained. Thus, the figure does not show wet etching that is performed on both sides of the base.

Generally, the higher the resolution that is required, the smaller the value of pitch in FIG. 4 that is required, and thus a value of width B should also be smaller. According to a formula (3), in order to get a smaller value of width B, a smaller value of PR width A or depth D is required.

However, the value of PR width A cannot become an infinitely small value because it is difficult to obtain a very small value of PR width A due to the characteristic of an exposure process. Although an infinitely small value is obtained, it may cause degradation of an etching factor.

In addition, there is also a limit to set the depth value D to a small value. This is because, although the method of etching both sides of the metal mask is used, referring to FIG. 3, the size of the undercut becomes larger when the depth D value becomes smaller, thus the electroluminescence material is not uniformly deposited on the substrate. Further, a thickness T of the metal mask cannot be decreased since there is a minimal thickness required to handle the metal sheet during wet etching.

In addition, it is also difficult to implement display devices with high resolutions by only performing wet etching. The reason may be found on fine structures shown in a top plan view.

The isotropic characteristic of wet etching is shown not only in the cross sectional shape of the mask but also in the top planar shape of the mask. As shown in FIG. 5, an actual processed 3D shape of the mask has a bowl shape, thus four edges of the mask are rounded and not sharp. Such characteristics are characteristics that are difficult to be applied in display devices that require sharp quadrangular or polygonal deposition areas. In particular, it is difficult for such characteristics to be applied in display devices with high resolutions such as QHD or UHD.

Therefore, it is difficult to implement display devices having resolutions of QHD (approximately 500 ppi) or UHD (approximately 800 ppi) by using conventional wet etching due to limits and correlations between factors of the shape described above.

Meanwhile, recently, a metal shadow mask is manufactured by using an ultrashort pulse laser. Korean Patent Application Publication Nos. 10-2013-0037482 and 10-2015-0029414 are typical techniques, and the applicant of the present invention has also filed applications for the related inventions (Korean Patent Application Nos. 10-2014-0182140 and 10-2015-0036810).

FIG. 6 is a view of showing a basic process of manufacturing a metal shadow mask by using a laser.

A method of manufacturing a metal shadow mask by using laser includes:

1. a first irradiating step of irradiating a laser beam onto a substrate while moving the laser beam along a first looped curve that corresponds to a shape of mask hole; and 2. a second irradiating step of irradiating the laser beam onto the substrate while moving the laser beam along a second looped curve that is provide inside the first looped curve and has a smaller internal area than that the first looped curve.

3. In addition, another method of manufacturing a metal shadow mask by using laser includes: a first irradiating step of irradiating laser beam having a first energy onto a position in which a mask hole is formed on a substrate; and a second irradiating step of irradiating the laser beam having a second energy that is lower than the first energy onto the same position onto which the laser beam of the first irradiating step is irradiated.

The method of manufacturing a metal shadow mask by using such a laser, in order to improve an accuracy of the processed metal mask, generally uses an ultrashort pulse laser. The metal base is gradually removed or processed by the accumulation of various low-intensity pulses by using the ultrashort pulse laser.

Such method using the laser has an effect of specifying an energy distribution or intensity of the laser beam irradiated onto the metal base by configuring a specific optical system or changing the intensity change of the laser or pulse modulation.

For example, it may be possible to manufacture a metal mask having a proper taper structure without including undercut by configuring an optical system having specific energy distribution and controlling the laser and a relative motion of the substrate (Refer to FIG. 7).

However, the biggest limitation of the above method is that it is difficult to ensure productivity capable of being used in industrial sites.

In other words, the metal processing method using the laser continuously applies energy to the metal base in pulse train of the laser and induces a removal of the metal material of the base that is gradually removed from the surface of the metal base. Herein, processing speed (amount of removed material) may be increased by applying increasing the intensity of the laser irradiated to the metal base. However, heat due to the high energy applied to the metal base cannot be sufficiently dissipated and is accumulated on the metal base, thus the accumulated heat causes degradation of processing quality.

In addition, the high energy pulse of the laser applied to a surface of the metal base causes burrs on the other surface of the metal base. The energy pulse of the laser is applied to the metal base, gradually processes the mask and induces a shape that passes through the metal base. However, when the metal base is mostly removed and the metal base has very thin thickness, just before the mask passes through the metal base, then an impact of the high energy pulse works as a force to protrude through the metal base to the opposite surface. In case of invar material, heights of burrs may be from several microns to several tens of microns from the back surface of the mask.

When the organic luminescent material is deposited by using the shadow mask including such burrs formed on the back surface of the mask, glass damage may occur since the shadow mask is not completely stuck to the glass and thus the shadow mask sticks out of the glass. As a result, deposition performance is degraded by the shadow effect.

In conclusion, in order to ensure a high quality shadow mask, the metal material should be gradually processed by applying multiple laser pulses having a minimum energy required for the processing. However, it is difficult to ensure sufficient productivity by using such method.

DISCLOSURE

Technical Problem

The present invention has been proposed to solve the problems in the related art and an object of the present invention is to provide a method of manufacturing a shadow mask, wherein hybrid processing including wet etching and laser processing is used to form a mask pattern including a laser-processed pattern and a wet-etched pattern on the shadow mask, and a shadow mask manufactured using the method.

Technical Solution

In order to achieve the above object, according to one aspect of the present invention, there is provided a method of manufacturing a shadow mask, wherein hybrid processing is used to form a mask pattern on the shadow mask, the method includes: forming a wet-etched pattern by performing wet etching from above a base; and forming a laser-processed pattern that continues from the wet-etched pattern, by performing laser processing from above the base or from below the base on which the wet-etched pattern is formed.

Also, at the forming the laser-processed pattern, a masking part having a masking pattern corresponding to the mask pattern of the shadow mask may be formed above an upper surface of the base, and a laser beam may be irradiated from above the masking part.

Herein, the masking part may be provided in plural, with respective masking patterns having different widths being formed on the masking parts, and when irradiating the laser beam from above the masking part, the laser beam may be irradiated from above each of the masking parts, so the irradiation of the laser beam is performed multiple times.

Further, when performing the irradiation of the laser beam multiple times, the laser beam may be irradiated from above a masking part having a masking pattern of a narrower width aperture as the irradiation of the laser beam goes to a last irradiation.

In addition, the masking pattern of the masking part may be formed above the upper surface of the base by a photoresist formed through a photolithography process, and when irradiating the laser beam from above the masking part, the laser beam may be irradiated onto a photoresist-removed area of the masking pattern of the masking part.

Also, the masking part may be a phase shift mask (PSM) that has a plurality of masking patterns having different widths and being capable of shifting a phase of the laser beam at different angles, and when irradiating the laser beam from above the masking part, the laser beam may be irradiated from above the phase shift mask (PSM) onto the base to pass through the masking patterns that shift the phase of the laser beam.

Further, the masking part may include a body through which the laser beam passes, and a slit-shaped masking pattern formed on an upper surface of the body, the masking pattern including a plurality of laser blocking parts separated from each other in a width direction of the body and a plurality of laser transmitting parts that are spaces defined between the laser blocking parts and transmit the laser beam therethrough, wherein the slit-shaped masking pattern is configured such that widths of the laser blocking parts become narrower in a direction from an exterior to a center of the body and widths of the laser transmitting parts become wider in the direction from the exterior to the center of the body, wherein when irradiating the laser beam from above the masking part, and the laser beam may be irradiated from above the slit-shaped masking pattern of the masking part such that intensity of the laser beam irradiated onto the base at a portion corresponding to a laser transmitting part having a relatively wider width is higher than intensity of the laser beam irradiated onto the base at a portion corresponding to a laser transmitting part having a relatively narrower width.

Meanwhile, the forming the laser-processed pattern may include: a first step of setting a unit processing area on the base; a second step of performing laser processing to form a part of the laser-processed pattern within the unit processing area while moving the laser beam along a first scan path from a first boundary to a second boundary of the unit processing area; a third step of turning the laser beam to a next direction, moving the laser beam by a step pitch, and performing laser processing to form another part of the laser-processed pattern within the unit processing area while moving the laser beam along a second scan path; and a fourth step of repeating the second and third steps until finishing laser processing while moving the laser beam along an nth scan path, thereby completing laser processing over an entire area of the unit processing area.

Herein, the forming the laser-processed pattern may further include setting a processing depth for each of the scan paths.

Also, the forming the laser-processed pattern may further include: setting a plurality of energy areas on a laser-processed pattern area within the unit processing area; and setting a processing depth for each of the energy areas by setting an accumulated energy distribution by the energy areas according to a sequence of intensity of the laser beam.

Further, the laser-processed pattern formed by laser processing may have an inner diameter that is gradually reduced in a direction from a laser-processed surface.

In addition, the forming the wet-etched pattern may include: forming a photoresist pattern on an upper surface of the base to form the wet-etched pattern, and performing wet etching on the base along a photoresist-removed area.

Also, at the forming the laser-processed pattern, laser processing may be performed in a direction same as or opposite to a wet etching direction.

Further, the laser-processed pattern formed by laser processing may be formed in the direction same as or opposite to the wet etching direction to continues from the wet-etched pattern.

In addition, the wet-etched pattern may be formed by wet etching up to 50% to 95% of an entire thickness of the base, and the laser-processed pattern may be formed by laser processing to a remaining thickness of the base.

Also, when the laser-processed pattern is tapered by gradually reducing an inner diameter thereof in a direction from a laser-processed surface, a tapered angle of the laser-processed pattern may be set to a range from 30 degrees to 90 degrees.

Further, the laser-processed pattern formed by laser processing may have burrs on a back surface thereof, the burrs protruding from the back surface to heights equal to or less than 1 μm.

Advantageous Effects

The present invention uses hybrid processing including wet etching and laser processing for manufacturing a shadow mask. The method has an effect on solving the productivity degradation of the conventional laser processing and provides a shadow mask with high quality using wet etching.

In addition, in the present invention, an approximate shape of the metal mask is formed by wet etching, thus an amount of a metal material to be additionally removed by laser processing is very small. Accordingly, a number of laser pulses to be applied to the metal material is reduced and the thermal accumulation effect of the conventional method (method of laser-processing the entire metal mask by using the laser) is also remarkably reduced. Therefore, there is an effect on providing a shadow mask with high quality.

Further, burrs formed on the back surface of the shadow mask may be minimized by performing laser processing with low energy pulses. Also, the present invention may manufacture a shadow mask without any burrs.

In addition, the undercut problem caused by the isotropic characteristic of wet etching is solved by using hybrid processing including wet etching and laser processing. Accordingly, the gradual deposition of an electroluminescence material that is deposited on a substrate is prevented, boundaries of the deposited electroluminescence material become clear, and thus performance of the display device is improved.

Also, factors of the shape that are used for forming the mask pattern are not restricted to their limitations by using hybrid processing including wet etching and laser processing, and thus the shadow mask of the present invention may be used for implementing display devices having resolutions of QHD (approximately 500 ppi) or UDH (approximately 800 ppi).

MODE FOR INVENTION

The present invention generally relates to a method of manufacturing a metal shadow mask used for a deposition process while manufacturing an organic EL devices or an organic semiconductor. More particularly, the present invention relates to a method of manufacturing a metal shadow mask, wherein hybrid processing including wet etching and laser processing are used to form a mask pattern having a laser-processed pattern and a wet-etched pattern on the shadow mask.

Thus, productivity degradation of conventional laser processing may be solved, and a shadow mask with high quality is provided by performing wet etching.

Figure 8:
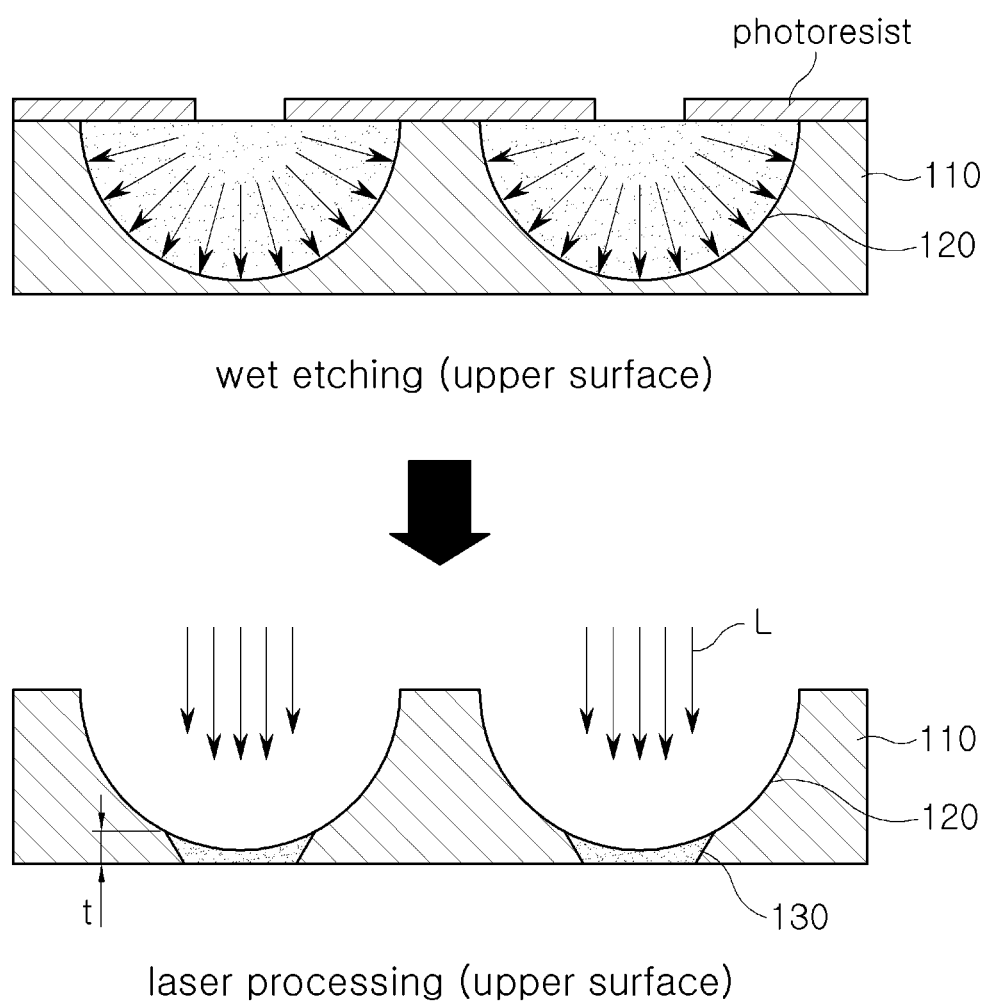
FIG. 8 is a schematic view of a method of manufacturing a shadow mask according to an embodiment of the present invention.

Hereinafter, exemplary embodiments of the present invention will be described in detail with reference to the accompanying drawings. FIG. 8 is a schematic view of a method of manufacturing a shadow mask according to an embodiment of the present invention, FIG. 9 is a schematic view of a method of manufacturing a shadow mask according to another embodiment of the present invention, FIGS. 10 to 15 are schematic views of laser processing according to various embodiments of the present invention, FIGS. 16 to 22 are schematic views of laser processing according to further various embodiments of the present invention, and FIG. 23 is a schematic view of a taper angle (a) of an aperture according to an embodiment of the present invention.

Figure 9:
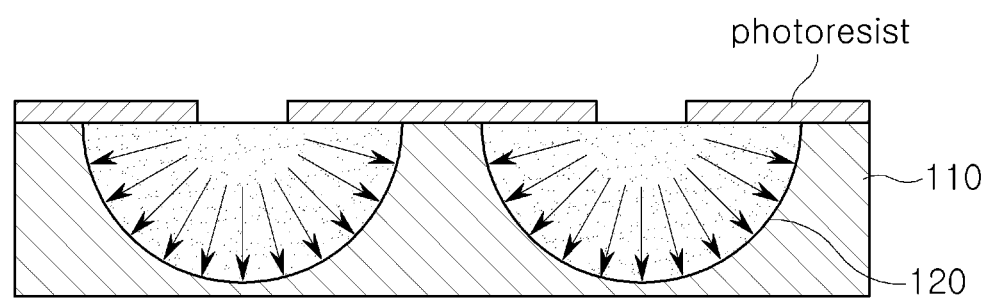
FIG. 9 is a schematic view of a method of manufacturing a shadow mask according to another embodiment of the present invention.
Figure 9:
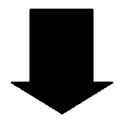
Figure 9:
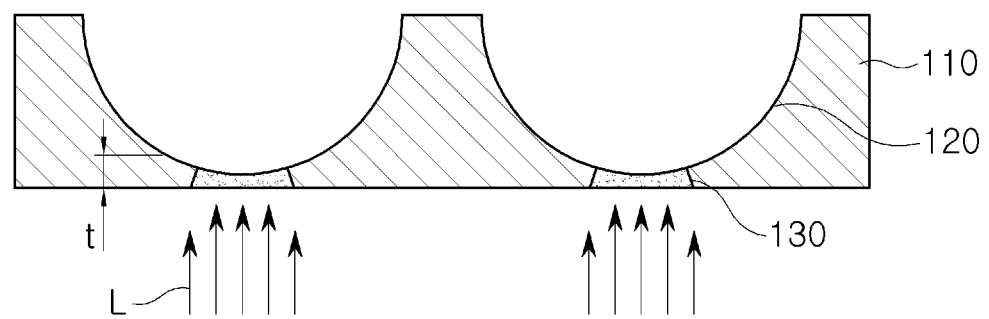

As shown in FIGS. 8 and 9, in a method of manufacturing a shadow mask according to the present invention, hybrid processing is used to form a mask pattern on the shadow mask. The method includes: forming a wet-etched pattern 120 by performing wet etching from above a base 110; and forming a laser-processed pattern 130 that continues from the wet-etched pattern 120, by performing laser processing from above the base 110 or from below the base 110 on which the wet-etched pattern 120 is formed.

In other words, the method of present invention manufactures the shadow mask that includes the mask pattern having the wet-etched pattern 120 and the laser-processed pattern 130.

Herein, a plurality of mask patterns formed on the shadow mask has a shape corresponding to a shape of a thin film pattern to be deposited on a substrate. The mask patterns are areas through which a deposition material passes, and areas other than the plurality of mask pattern areas on the base 110 are blocking areas through which the deposition material cannot pass.

In other words, the shadow mask is configured to have the mask pattern that includes blocking areas through which the deposition material cannot pass and a plurality of mask patterns that are formed to be mutually separated from each other and the blocking area. As described above, the mask pattern of the shadow mask refers to an arranged shape or arranged configuration of the plurality of mask patterns.

The present invention discloses a method for manufacturing a shadow mask having such a mask pattern, and discloses a method of manufacturing the shadow mask, wherein hybrid processing is used to form the mask pattern having a wet-etched pattern formed by wet etching and a laser-processed pattern formed by laser processing.

FIG. 8 is a schematic view of the method of manufacturing the shadow mask according to an embodiment of the present invention, wherein the wet-etched pattern 120 is formed on the base 110 by performing wet etching from above the base 110 (upper surface of the base 110), and the laser-processed pattern 130 that continues from the wet-etched pattern 120 is formed by the irradiating a laser beam L from above base 110 (upper surface of the base 110) on which the wet-etched pattern 120 is formed.

In other words, in order to implement a metal mask that is used for products with high resolutions, wet etching is not performed on both sides of the base 110. As shown in FIG. 8, first, wet etching is performed on one side of the base 110 and then laser processing is additionally performed on the base 110 to form an aperture in a direction same as a wet etching direction to precisely form the aperture of the shadow mask.

FIG. 9 is a view showing a method of manufacturing a shadow mask according to another embodiment of the present invention, wherein the wet-etched pattern 120 is formed on the base 110 by performing wet etching from above of the base 110 (upper surface of the base 110) and the laser-processed pattern 130 is formed on the base 110 that continues from the wet-etched pattern 120, by irradiating the laser beam L from below the base 110 (lower surface of the base 110) on which the wet-etched pattern 120 is formed.

In other words, first, wet etching is performed on one surface of the base 110, and then laser processing is additionally performed on another surface of the base 110 to form the aperture, thus dimension and shape stability of the aperture are secured.

Herein, an undercut shape of the mask pattern can be minimized by controlling an energy distribution shape of the irradiated laser beam to be close to a flat-top beam by using a proper optical system. Therefore, organic luminescent materials may be homogeneously and maximally deposited on a substrate possible during the deposition process. This embodiment has an advantage that laser processing may be performed on a surface on which a photoresist is not formed.

Also, when wet etching is performed on both surfaces of the base, an undercut shape is essentially formed by performing wet etching on both surfaces. Then, the undercut shape is locally removed by using the laser beam, thereby a precise aperture may be formed.

First of all, a shape of a metal mask is approximately formed by wet etching, thus the method has an advantage that an amount of removal of a metal material is very small while performing the additional laser processing.

Accordingly, a number of laser pulses to be applied to the metal material may be reduced, and a thermal accumulation effect may be also remarkably reduced compared with the conventional laser processing (method of processing the entire metal mask by laser processing).

As a result, metal masks having fine structures including a precise aperture may be manufactured.

When forming the wet-etched pattern 120 according to the present invention, a photoresist pattern is formed on an upper surface of the base 110 to form the wet-etched pattern 120 and wet etching is performed along the base 110 in which the photoresist is removed.

The laser-processed pattern 130 that continues from the wet-etched pattern 120 to be described later may be formed by performing laser processing in a direction same as the wet etching direction, as shown in FIG. 8. Alternatively, the laser-processed pattern 130 that continues from the wet-etched pattern 120 may be formed by performing laser processing on the base 110 in a direction opposite to the wet etching direction, as shown in FIG. 9.

When the laser-processed pattern 130 is formed to the direction opposite to the wet etching direction, the laser-processed pattern 130 formed by laser processing may have a thickness t that is equal to or less than 40% of the entire thickness of the base 110. Dimension and shape stability of the aperture of the shadow mask are secured by the thickness of the laser-processed pattern 130.

Thus, as shown in FIG. 8, according to the need, the laser-processed pattern may be formed in the direction same as the wet etching direction (upper surface of the base→upper surface of the base), or alternatively, as shown in FIG. 9, the laser-processed pattern may be formed in the direction opposite to the wet etching direction (upper surface of the base→lower surface of the base).

The present invention discloses various modifications of laser processing as shown in FIGS. 10 to 15 and 16 to 22, in particular, a proper method of forming a tapered laser-processed pattern 130 by gradually reducing an inner diameter thereof in a direction from a wet-etched surface is disclosed.

When forming the laser-processed pattern 130 by laser processing according to an embodiment of the present invention, a masking part having a masking pattern corresponding to the mask pattern of the shadow mask is formed above an upper surface of the base 110, and the laser beam L is irradiated from above the masking part.

Figure 10:
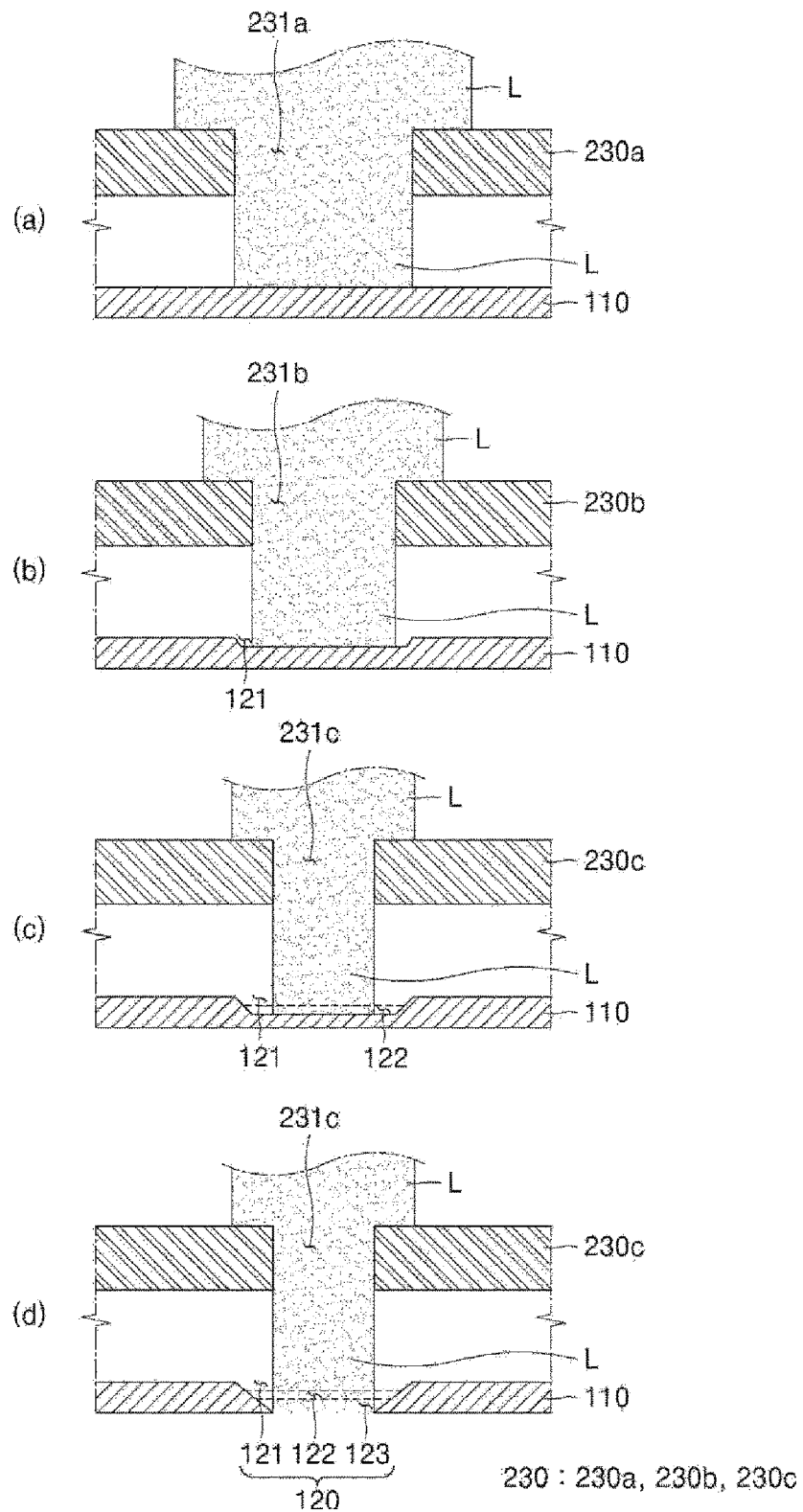
FIGS. 10 to 15 are schematic views of laser processing according to various embodiments of the present invention.

FIG. 10 is a view for explaining a plurality of masking parts 230*a*, 230*b*, and 230*c* and shows a method of forming the laser-processed pattern 130 by laser processing according to a first embodiment of the present invention.

A plurality of masking parts 230*a*, 230*b*, and 230*c* is provided and respective masking patterns having different widths are formed on the masking parts 230*a*, 230*b*, and 230*c*. The process of irradiating the laser beam L above the masking parts 230*a*, 230*b*, and 230*c* includes a process of irradiating the laser beam L from above each of the masking parts 230*a*, 230*b*, and 230*c*, so the laser beam L is irradiated multiple times. When performing the irradiation of the laser beam L multiple times, the laser beam L is sequentially irradiated from above the masking parts 230*a*, 230*b*, and 230*c* having a masking pattern of a narrower width aperture as the irradiation of the laser beam L goes to a last irradiation.

In other words, the mask pattern of the shadow mask for the method of manufacturing the shadow mask according to the first embodiment has an aperture shape that passes through the masking parts 230*a*, 230*b*, and 230*c* in longitudinal direction. In other words, in the first embodiment, the base 110 is processed by passing the laser beams L through the plurality of masking parts 230*a*, 230*b*, and 230*c* that have different sizes of apertures 231*a*, 231*b*, and 231*c* through which the laser beams L respectively passes. Therefore, a shadow mask having the laser-processed pattern 130 with a sloped aperture is obtained.

Figure 11:
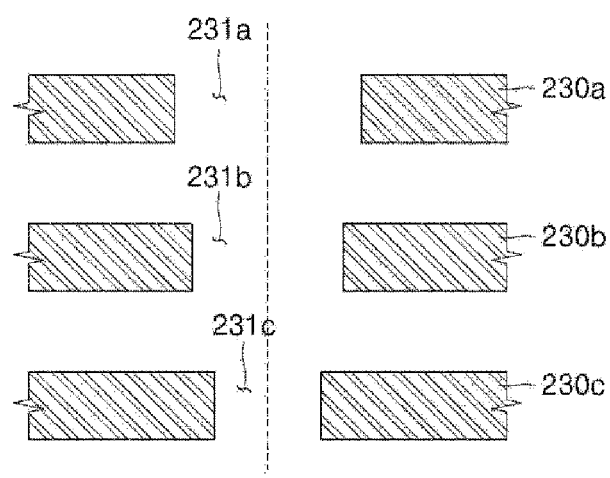

First, referring to FIG. 11, the plurality of masking parts 230*a*, 230*b*, and 230*c* are described. For example, three masking parts 230*a*, 230*b*, and 230*c* are provided. Hereinafter, the masking parts 230*a*, 230*b*, and 230*c* are described as a first masking part 230*a*, a second masking part 230*b*, and a third masking part 230*c*.

Herein, the first masking part 230*a* is used at first when irradiating the laser beam L and has an aperture area (hereinafter, first aperture 231*a*) that is the largest among the three masking parts 230*a*, 230*b*, and 230*c*. The second masking part 230*b* is used next to the first masking part 230*a* and has an aperture area (hereinafter, second aperture 231*b*) that is smaller than the first aperture 231*a* of the first masking part 230*a*.

In addition, the third masking part 230*c* is used last and has an aperture area (hereinafter, third aperture 231*c*) that is smaller than the second aperture 231*b* of the second masking part 230*b*. The first to third apertures 231*a*, 231*b*, and 231*c* of the masking parts 230*a*, 230*b*, and 230*c* have a concentric axis.

Also, areas of the first to third apertures 231*a*, 231*b*, and 231*c* are smaller than an area of the laser beam L that passes through a diffractive optical part. Herein, the laser beam L may be irradiated onto the base 110 always having the same area, and the area is larger than the first aperture 231*a*.

Thus, the area of the laser beam L is larger than the areas of the first to third apertures 231*a*, 231*b*, and 231*c*. Therefore, the laser beams L that pass through the first to third apertures 231*a*, 231*b*, and 231*c* of the laser beam L passing through the diffractive optical part, is irradiated onto the base 110 by passing a zoom lens part and a projection part. The laser beam L that irradiates toward the external areas of the first to third apertures 231*a*, 231*b*, and 231*c* is blocked or shielded and is not irradiated onto the base 110. Herein, under necessity, according to a size of the masking pattern to be formed on the shadow mask, intervals and patterns of the laser beam L are adjusted by adjusting distances between lenses of the zoom lens part, and then the adjusted laser beam L is irradiated onto the base 110.

The first embodiment uses three masking parts 230a, 230b, and 230c, but it is not limited thereto. Two or more than four masking parts may be used.

In addition, the first to third masking parts 230a, 230b, and 230c are made of chromium (Cr)-based material, but it is not limited thereto. Various materials are applicable to the masking parts that shield or block the laser beam L.

Hereinafter, the method of manufacturing the shadow mask using the laser-processed pattern 130 formed by laser processing according to the first embodiment is described in detail.

First, the base 110 is arranged on a stage. Herein, the base 110 according to the first embodiment has a plate shape and is made of metal, for example, invar alloy.

Then, the laser beam L is configured to pass through the diffractive optical part, the masking part 230, the zoom lens part, the projection part and reach the upper surface of the base 110. Herein, distances between lenses of the zoom lens part are adjusted according to the size and shape of the mask pattern of the shadow mask. Next, the laser beam L is output from a beam source, and the laser beam L is irradiated onto the base 110 by passing through the first aperture 231a of the first masking part 230a, the zoom lens part, and the projection part.

Herein, the area of the laser beam L passing through the diffractive optical part and irradiated toward the first masking part 230a is formed to be wider than the area of the first aperture 231a such that edge sharpening is implemented on the base 110 by passing through the masking part 230. Thus fine laser patterning is available. The laser beam L that passes through the first aperture 231a of the laser beam L passing through the diffractive optical part and the first masking part 230a, is irradiated onto the base 110, and the laser beam L that is irradiated toward areas besides the first aperture 231a is blocked by the first masking part 230a.

In other words, although the area of laser beam L passing through the diffractive optical part is wider than the first aperture 231a, the area of the laser beam L is adjusted to the area corresponding to the first aperture 231a by the first masking part 230a (Refer to FIG. 10a). When the laser beam L is irradiated onto the base 110 corresponding to the first aperture 231a for a predetermined time, the area of the base 110 onto which the laser beam L is irradiated is removed to a predetermined depth by reaction phenomena such as breaking combination structure, etc.

Therefore, as shown in FIG. 10b, a groove having a predetermined depth (hereinafter, first groove 121) is formed on the base 110.

When the first groove 121 is formed on the base 110 by using the first masking part 230a, the first masking part 230a is put away and the second masking part 230b is arranged above the upper surface of the base 110.

Herein, a position of the second masking part 230b is adjusted such that the center of the first groove 121 formed on the base 110 and the center of the second aperture 231b of the second masking part 230b become a concentric axis.

Next, when the laser beam L is output, as shown in FIG. 10b, the laser beam L is irradiated onto the base 110 by passing the second aperture 231b of the second masking part 230b. Herein, the area of the laser beam L passing through the diffractive optical part and irradiated toward the second masking part 230b is wider than the area of the second aperture 231b.

Thus, the laser beam L that passes through the second aperture 231b of the laser beam L passing through the diffractive optical part and irradiated toward the second masking part 230b, is irradiated onto the base 110, and the laser beam L irradiated toward areas besides the second aperture 231b is blocked by the second masking part 230b.

In other words, the area of the laser beam L is adjusted to the area corresponding to the second aperture 231b by the second masking part 230b, and then the laser beam L is irradiated onto the base 110 (Refer to FIG. 10b). The laser beam L passing through the second aperture 231b is irradiated onto the first groove 121, and the area onto which the laser beam L is irradiated is smaller than a lower surface of the first groove 121.

When the laser beam L is irradiated onto the lower surface of the first groove 121 for a predetermined time, the area of the base 110 onto which the laser beam L is irradiated is removed to a predetermined depth by reaction phenomena such as breaking combination structure, etc., thus a second groove 122 is formed on the lower surface of the first groove 121, as shown in FIG. 10c.

Then, when the second groove 122 is formed on the base 110 by using the second masking part 230b, the second masking part 230b is put away, and the third masking part 230c is arranged between the diffractive optical part and the zoom lens part.

Herein, a position of the third masking part 230c is adjusted or a position of the laser beam L is adjusted by using the zoom lens part and the projection part such that the center of the second groove 122 formed on the base 110 and the center of the third aperture 231c of the third masking part 230c become a concentric axis. Then, when the laser beam L is output by operating the beam source, as shown in FIG. 10c, the laser beam L is irradiated onto the base 110 by passing the third aperture 231c of the third masking part 230c, the zoom lens part and the projection part.

Herein, the area of the laser beam L irradiated toward the third masking part 230c is wider than the third aperture 231c. Thus, the laser beam L that passes through the third aperture 231c of the laser beam L irradiated toward the third masking part 230c is irradiated onto the base 110, and the laser beam L irradiated toward areas besides the third aperture 231c is blocked by the third masking part 230c.

In other words, the area of the laser beam L is adjusted to the area corresponding to the third aperture 231c by the third masking part 230c, and then the laser beam L is irradiated onto the base 110 (Refer to FIG. 10c). The laser beam L passing through the third aperture 231c is irradiated onto the second groove 122, and the area onto which the laser beam L is irradiated is smaller than a lower surface of the second groove 122.

When the laser beam L is irradiated onto the lower surface of the second groove 122 for a predetermined time, the area of the base 110 onto which the laser beam L is irradiated is removed to a predetermined depth by reaction phenomena such as breaking combination structure, etc., thus a third groove 123 is formed on the lower surface of the second groove 122 and the base 110 is open to the lower surface, as shown in FIG. 10d.

Therefore, the third groove 123 is formed on the lower surface of the second groove 122 by laser processing using the third masking part 230c. Finally, as shown in FIG. 10d, the laser-processed pattern 130 passing through the base 110 in the longitudinal direction is formed on the base 110, and the laser-processed pattern 130 has an aperture shape in which diameter or inner diameter gradually reduces toward the lower surface of the base 110.

The first to third masking parts 230a, 230b, and 230c respectively include a plurality of apertures. The laser beams L that are branched by passing the diffractive optical part pass through the masking patterns of the masking part 230 that are mapped to one-to-one, and the branched laser beams L reach the base 110 at the same time such that the plurality of laser-processed patterns 130 are formed on the base 110. Also, when an area of the base 110 is large, the shadow mask may be manufactured by forming the plurality of the laser-processed patterns 130 on the entire area of the base 110 by moving the base 110 using the stage.

Figure 12:
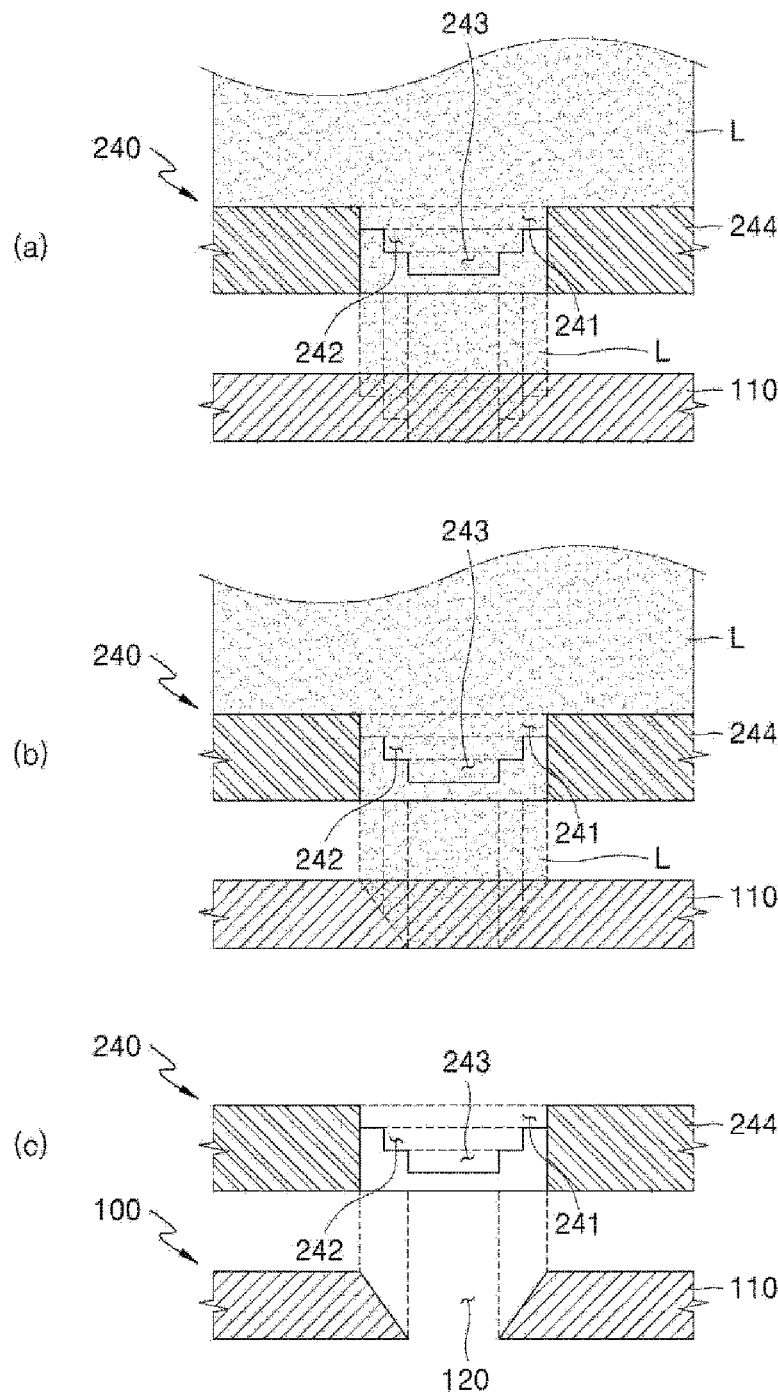
Figure 13:
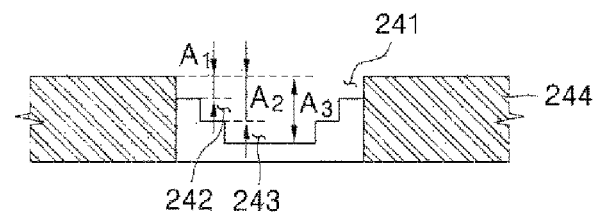

FIG. 12 is a view that sequentially shows method of forming the laser-processed pattern 130 by laser processing according to a second embodiment of the present invention. FIG. 13 is a view for explaining a masking part provided to manufacture a shadow mask according to the method of the second embodiment.

The method of manufacturing the shadow mask according to the second embodiment uses a phase shift mask technique, and the phase shift mask is used for the masking part 240. A patterning method using the phase shift mask is well known in the art, and the method uses mutual interferences between transmitted light by applying phase shifts to the transmitted light.

The masking pattern of the shadow mask of the method of manufacturing the shadow mask according to the second embodiment uses the masking part 240 having a plurality of phase shifters 241, 242, and 243. In other words, the masking part 240 according to the second embodiment of the present invention has a plurality of phase shifters 241, 242, and 243 that are arranged in a stepped shape.

A phase shift mask (PSM) is well known in the art, and any one of the known and various types of the phase shift mask may be used.

For example, as shown in FIG. 13, the phase shift mask used for the masking part 240 of the second embodiment is configured to include a body having a predetermined area, the body including phase shifters 241, 242, and 243 through which the laser beam L passes and a laser blocking part 244 arranged in the exterior of the phase shifters 241, 242, and 243 whereat the laser beam L is blocked.

In other words, a part of the body of the masking part 240 is an area including the phase shifters 241, 242, and 243 and periphery areas of the phase shifters 241, 242, and 243 are laser blocking areas at which the laser beam L is blocked.

Herein, the phase shifters 241, 242, and 243 are provided in plural, with respective phase shifters having different areas to each other. The phase shifters 241, 242, and 243 are sequentially arranged in a height direction of the body and have a stepped shape. According to the second embodiment of the present invention, the plurality of phase shifters 241, 242, and 243 have a groove shape that is formed by processing the body.

In other words, the masking part 240 according to the second embodiment includes: a first phase shifter 241 having a groove shape with a first area and is formed from an upper surface of the body having a first depth A1; a second phase shifter 242 having a groove shape with a second area that is smaller than the area of the first phase shifter 241 (first area) and is formed from the upper surface of the body having a second depth A2 that is deeper than the first depth A1; a third phase shifter 243 having a groove shape with a third area that is smaller than the area of the second phase shifter 242 (second area) and is formed from the upper surface of the body having a third depth A3 that is deeper than the second depth A2; and the laser blocking part 244 arranged at the exterior of the first phase shifter 241 on an area of horizontal direction of the body.

Phases of the first phase shifter 241, the second phase shifter 242, and the third phase shifter 243 are shifted about, for example, 60 degrees, 120 degrees, and 180 degrees.

Therefore, a phase of the laser beam L irradiated from above the masking part 240 is gradually shifted or reversed by passing through the first to third phase shifters 241, 242, and 243.

In other words, the phase of the laser beam L is continuously shifted on a border between the first phase shifter 241 and the second phase shifter 242 and a border between the second phase shifter 242 and the third phase shifter 243.

Herein, intensity changes and phase shifts of the laser beam L occur by phase differences (for example, 60 degrees, 120 degrees, and 180 degrees) between the first phase shifter 241, the second phase shifter 242, and the third phase shifter 243. Technically, as shown in FIG. 12b, the laser beam L is irradiated in a cascade dispersion or shape. However, the laser beam L is not actually irradiated in the cascade shape due to a limitation of resolutions, and is irradiated to have a slope as shown in FIG. 12c.

The masking part 240 having the first to the third phase shifters 241, 242, and 243 described above may be obtained by etching the body.

In addition, the body may be made of quartz through which the laser beam L passes, the body made of quartz may include the first to the third phase shifters 241, 242, and 243. The laser blocking part 244 may be included inside the body and be a film, a thin film, or a block that blocks the laser beam L. Of course, the laser blocking part 244 may not be included inside the body but may be arranged in the upper surface of the body or in the exterior of the first phase shifter 241.

In the above, the masking part 240 of the second embodiment is obtained by processing the body itself to have a groove shape having the first to the third phase shifters 241, 242, and 243, but it is not limited thereto. A thin film in which the phase of the laser beam L is shifted may be formed on the upper surface of the body. Herein, the phase shifters of the thin film formed on the upper surface of the body are formed to have a cascade shape steps in the height direction of the body.

Hereinafter, referring to FIG. 12, a method of forming the laser-processed pattern 130 by laser processing according to the second embodiment of the present invention is disclosed.

First, the base 110 is arranged on the stage. The masking part 240 of the second embodiment is arranged between the diffractive optical part and the zoom lens part. Then, the laser beam L is output by operating the beam source and irradiated toward the masking part 240.

Herein, the laser beam L that heads to the first to the third phase shifters 241, 242, and 243 of the irradiated laser beam L, passes through the zoom lens part and the projection part and is irradiated onto the base 110. The laser beam L heading to the laser blocking part 244 is not irradiated onto the base 110 and is blocked by the laser blocking part 244. The phase of the laser beam L irradiated from above the masking part 240 and passing through the first to the third phase shifters 241, 242, and 243 is gradually and continuously shifted. Thus, as shown in FIG. 12b, the laser-processed pattern 130 in which an inner diameter or width gradually reduces toward the lower surface of the base 110 is obtained.

Figure 14:
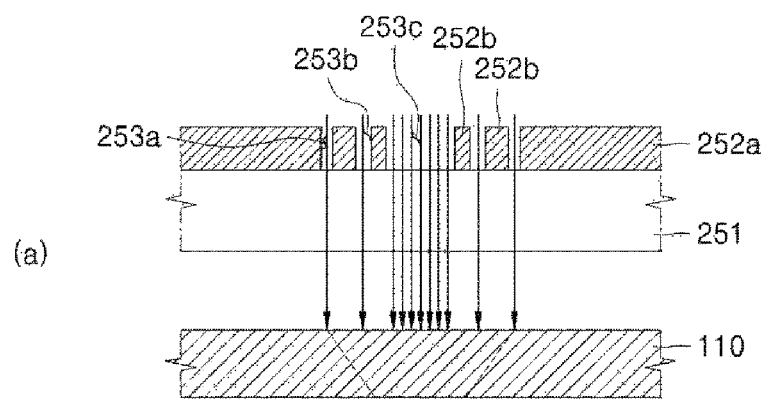
Figure 14:
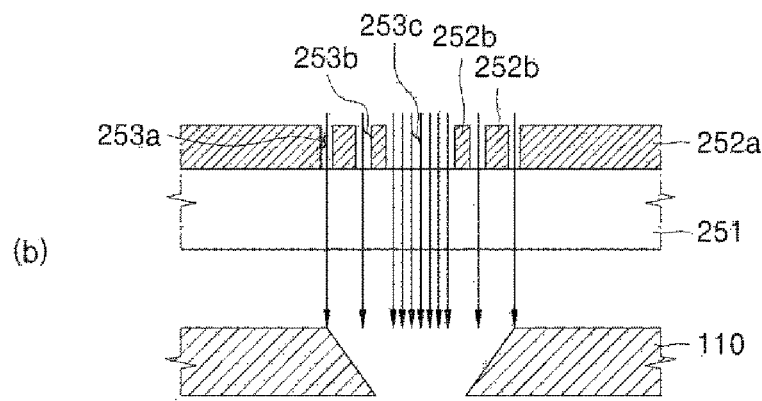
Figure 15:
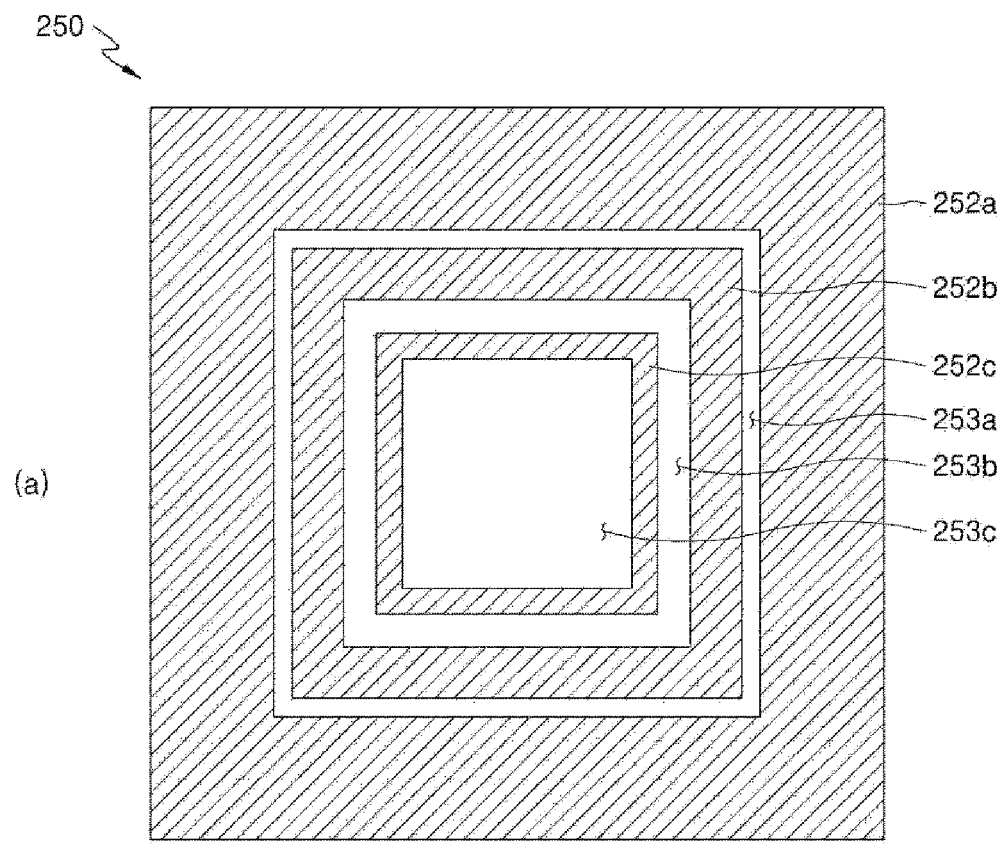
Figure 15:
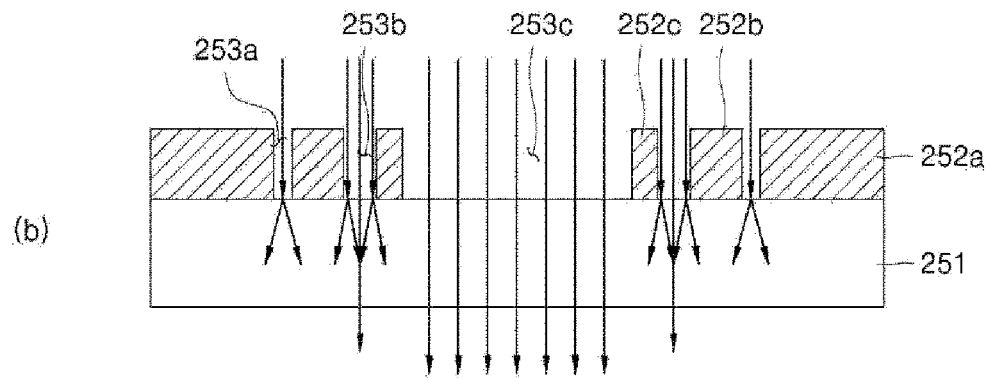

FIG. 14 is a view that sequentially shows a method of forming a laser-processed pattern 130 by laser processing according to a third embodiment of the present invention. FIG. is a view for explaining a masking part provided to manufacture a shadow mask according to the method of the third embodiment.

As shown in the figures, the method of manufacturing the shadow mask according to the third embodiment uses a slit masking part, and a slit mask is used for manufacturing the shadow mask. As shown in FIGS. 15a and 15b, the slit mask includes a body 251 through which the laser beam L passes and a plurality of laser blocking parts 252a, 252b, and 252c that block the laser beam L are formed on an upper surface or inside the body 251. Intensity of the laser beam L irradiated onto the base 110 is adjusted by forming the plurality of laser blocking parts 252a, 252b, and 252c to have different widths.

According to the embodiment of the present invention, in order to manufacture a shadow mask that has a trapezoid or quadrangular pyramid shape in which an inner diameter gradually reduces toward the lower surface of the base 110, the masking part 250 according to the third embodiment is configured such that the plurality of laser blocking parts 252a, 252b, and 252c are formed on the body separated from each other and spaces defined between the laser blocking parts 252a, 252b, and 252c are areas in which the laser beam L transmits therethrough. As shown in FIGS. 15a and 15b, the plurality of laser blocking parts 252a, 252b, and 252c are configured such that widths of the laser blocking parts 252a, 252b, and 252c become narrower in a direction from an exterior to the center of the body.

In other words, the masking part 250 is configured such that widths of the laser transmitting parts between one laser blocking part (one of the 252a, 252b, and 252c) and another laser blocking part (one of the 252a, 252b, and 252c) become wider in the direction from the exterior to the center of the body.

When the laser beam L is irradiated from above such a masking part 250, intensity of the laser beam L irradiated onto the base 110 at a portion corresponding to a laser transmitting part having a relatively wider width is higher than intensity of the laser beam L irradiated onto the base 110 at a portion corresponding to a laser transmitting part having a relatively narrower width. According to the third embodiment, the widths of the laser transmitting parts become wider in the direction from the exterior to the center of the body, the intensity of the laser beam L becomes higher in the direction from the exterior to the center of the body.

Hereinafter, referring to FIG. 14, a method of forming the laser-processed pattern 130 by laser processing according to the third embodiment of the present invention is disclosed.

First, the base 110 is arranged on the stage. The masking part 250 of the third embodiment is arranged between the diffractive optical part and the zoom lens part. Then, the laser beam L is output by operating the beam source and is irradiated toward the masking part 250.

Herein, the laser beam L that heads to the first to the third laser transmitting areas 253a, 253b, and 253c of the irradiated laser beam L, passes through the zoom lens part and the projection part and is irradiated onto the base 110. The laser beam L heading to the laser blocking part 252a of the masking part 250 is not irradiated onto the base 110 and is blocked by the laser blocking part 252a.

Herein, intensity of the laser beam L passing through a second laser transmitting area 253b that is positioned farther inside toward the center of the body 251 than the first laser transmitting area 253a and which is irradiated onto the base 110 is higher than the intensity of the laser beam L passing a first laser transmitting area 253a that is positioned in the extreme border of the body 251 and which is irradiated onto the base 110. The intensity of the laser beam L passing through a third laser transmitting area 253c that is positioned farther inside toward the center of the body 251 than the second laser transmitting area 253b and which is irradiated onto the base 110 is higher in intensity than of the laser beam L passing the second laser transmitting area 253b.

According to the intensity changes of the laser beam L for each laser transmitting area, as shown in FIG. 14b, the mask pattern having an inner diameter or width that gradually reduces toward the lower surface of the base 110 is obtained.

According to a fourth embodiment of the present invention, the masking pattern of the masking part is formed above the upper surface of the base by a photoresist formed through a photolithography process, wherein when irradiating the laser beam L from above the masking part, the laser beam L is irradiated onto a photoresist-removed area of the masking pattern of the masking part.

According to circumstances, the photoresist is formed on the upper surface of the base and laser processing may be performed on the base in which the photoresist is not removed by the development process. Herein, the laser beam is irradiated onto the photoresist, not onto the base. Thus, the photoresist and the base are processed at the same time.

Thus, the method of manufacturing the shadow mask according to the first to the fourth embodiments of the present invention forms the laser-processed pattern 130 on the base 110 by irradiating the laser beam L onto the base 110. Then, the wet-etched pattern 120 is formed by wet etching such that a surface of the laser-processed pattern 130 becomes smooth. Therefore, a metal shadow mask with improved quality is provided.

A method of forming the laser-processed pattern according to another embodiment of the present invention includes: a first step of setting a unit processing area on the base; a second step of performing laser processing to form a part of the laser-processed pattern within the unit processing area while moving the laser beam along a first scan path from a first boundary to a second boundary of the unit processing area; a third step of turning the laser beam to a next direction, moving the laser beam by a step pitch, and performing laser processing to form another part of the laser-processed pattern within the unit processing area while moving the laser beam along a second scan path; and a fourth step of repeating the second and third steps until finishing laser processing while moving the laser beam along an $n^{th}$ scan path, thereby completing laser processing over an entire area of the unit processing area.

The laser-processed pattern is formed to continue from the wet-etched pattern, and the unit processing area of the present invention refers to an area in which the laser-processed pattern is formed by setting a laser processing device at once. Alternatively, a user may set the unit processing area by randomly designating a specific area on the base. Such a unit processing area may include one or more laser-processed patterns. It is preferable to set the unit processing area to be large considering processing speed.

Such a unit processing area may be set one time or plural plurality of times. The laser-processed pattern continuing from the wet-etched pattern is completed when the unit processing area is completely processed.

Figure 16:
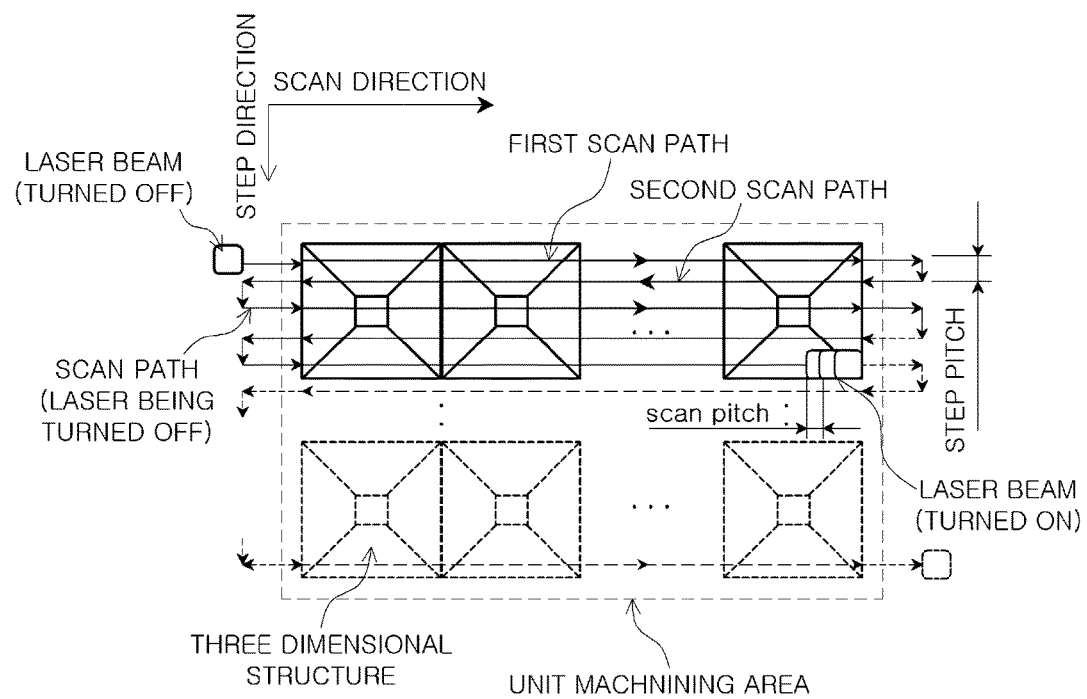
FIGS. 16 to 22 are schematic views of laser processing according to further various embodiments of the present invention.

Meanwhile, as shown in FIG. 16, in the method of forming the laser-processed pattern continuing from the wet-etched pattern according to the present invention, first, the unit processing area is set on the base on which the wet-etched pattern is formed (first step).

The unit processing area may include one or plurality of laser-processed patterns, and is set as a virtual area on the base.

In detail, a length of the unit processing area refers to a length in which the laser beam is capable of moving along one scan path without turning direction thereof. A width of the unit processing area is generally set to a step pitch that will be described later in which the laser beam turns the direction thereof.

When setting such a unit processing area, the unit processing area is totally processed without dividing and processing several times the unit processing area by setting the unit processing area in which the entire area of the laser-processed pattern is included within thereof. A stitching problem that is caused by dividing and processing the entire area of a processing object into several numbers by using a conventional scanner device may be removed.

In addition, it is possible to remove a stitching effect while processing a large sized base by setting the unit processing area to be identical to the large sized base.

Then, the laser beam moves along a first scan path from the first boundary of the unit processing area to the second boundary of the unit processing area, and the laser beam processes a part of the laser-processed pattern included within the unit processing area (second step).

In other words, the first scan path is set from one boundary of the unit processing area to another boundary of the unit processing area, and the laser beam processes a part or the entirety of the laser-processed pattern included within the unit processing area while moving along the first scan path.

When the laser beam reaches the another boundary of the unit processing area by moving along the first scan path, then the laser beam turns its direction to a next step, moves by a step pitch and processes another part of the laser-processed pattern while moving along the second scan path (third step).

In other words, when the laser beam reaches another boundary of the unit processing area, the laser beam is turned off, turns to the next step, and moves by the step pitch. Then, the second scan path is set, and herein, the laser beam is turned on.

The step pitch refers to a distance between neighboring scan paths, for example, a distance between the first scan path and the second scan path, and refers to a distance from the center of the laser beam moving along the first scan path to the center of the laser beam moving along the second scan path.

Herein, as shown in FIG. 10, the first scan path and the second scan path may be set to have same directions, alternatively, may be set to have opposite directions. In other words, the laser beam may be set to move in the opposite direction. In other words, an $n-1^{th}$ scan path and an $n^{th}$ scan path may be set such that the laser beam moves in a direction same as or opposite to each other. However, it is not limited thereto, and several scan paths may be set to a specific direction, or to opposite to the specific direction, or to a combination of the two.

In addition, the step pitch in which the laser beam turns its direction from the first scan path to the second scan path is set to be equal to or smaller than a size of the laser beam of the first scan path such that an uniform patterning is processed. In other words, the step pitch in which the laser beam turns its direction from an $n-1^{th}$ scan path to an $n^{th}$ scan path is equal to or smaller than a size of the laser beam of the $n-1^{th}$ scan path.

In addition, an $n-1^{th}$ scan pitch and an $n^{th}$ scan pitch may be set to be different to each other according to a shape of the laser-processed pattern. Herein, the scan pitch follows the formula: scan pith=v/f (v: relative speed of laser beam and base operated by operating part, f: pulse frequency of laser beam source applied to base). The scan pitch refers to a distance between consecutive laser beams and is determined by considering a relative speed of the laser beam and the base, and a pulse frequency of the laser beam source.

Such a scan pitch is used for a reference to set an overlap rate of the laser beam which will be described later, and when the scan pitches become narrower, the overlap rate is increased. The overlap rate has an effect on setting a processing depth of the laser-processed pattern.

Next, the first step and the second step are repeated until finishing laser processing while moving the laser beam along an $n^{th}$ scan path, thereby completing laser processing over an entire area of the unit processing area (fourth step).

As shown in FIG. 16, the laser beam processes the part of the laser-processed pattern within the first scan path from the first boundary of the unit processing area while moving along the first scan path. When the laser beam reaches the second boundary of the unit processing area, the laser beam turns its direction to the next step, moves by the step pitch, processes the another part of the laser-processed pattern while moving along the second scan path and reaches back to the first boundary of the unit processing area. The above processes are repeated until the $n^{th}$ scan path is set, and then the laser beam processes the laser-processed pattern while moving along the $n^{th}$ scan path and reaches on one of the boundaries of the unit processing area, thereby the laser beam completes laser processing over the entire area of the unit processing area.

Thus, a number of direction turnings of the laser beam occurring during laser processing is remarkably reduced (processing by moving along the scan path→turning to the next step and moving). The laser-processed pattern is processed by repeatedly performing simple processing procedures. Thus, productivity of the laser-processed pattern is improved.

Therefore, the present invention discloses a method of forming the laser-processed pattern on the base continuing from the wet-etched pattern by using the laser beam. The unit processing area is set on the base, and laser processing is performed on each of the unit processing areas by setting the scan path in which the laser beam moves along the scan path to a specific scan pitch distance on the unit processing area. Accordingly, thermal energy accumulation is prevented, thus the base is protected and fine patterns can be formed on the base.

In addition, the laser-processed pattern included within the processing area includes several scan paths. Thus, in order to complete laser processing of the laser-processed pattern, laser processing is performed on the entire scan paths within the laser-processed pattern. Therefore, the thermal energy accumulation on the base is prevented by intermittently processing and giving pause time to laser processing while forming the laser-processed pattern, so the base is protected and fine patterns are formed on the base.

Meanwhile, when the laser beams moves along the scan path, a processing depth for each scan path may be set. In other words, a processing depth of the first scan path may be set to a specific value, a processing depth of the second scan path may be set to other specific value, and a processing depth of the $n^{th}$ scan path may be set to another specific value or to a value that is symmetrical to the scan path mostly placed in the center of the processing area. The processing depth may be variously set according to the shape of the laser-processed pattern, and setting such a processing depth may be implemented by controlling an accumulated energy distribution of the laser beam.

First, in order to set the processing depth, the processing depth is controlled by the overlap rate of the laser beam that moves along the scan path [overlap rate={(size of laser beam–scan pitch)/size of laser beam}×100, scan pitch=v/f, v: relative speed of laser beam and base operated by operating part, f: pulse frequency of laser beam source applied to base].

The processing depth according to the overlap rate of the laser beam may be set by fixing a pulse frequency value of the laser beam source and varying the relative speed of the laser beam for each scan path, or may be set by fixing the relative speed of the laser beam and varying the pulse frequency value for each scan path.

In other words, the overlap rate of the laser beam may be set by controlling the scan pitch according to the size of the laser beam. From the formula: scan pitch=v/f, a degree of the overlap rate of the laser beam for each scan path is controlled by adjusting values of the relative speed of the laser beam and pulse frequency. The processing depth is set by controlling the degree of the overlap rate, thus the deeper the processing depth is set, the larger the overlap rate of the laser beam is set.

Figure 17:
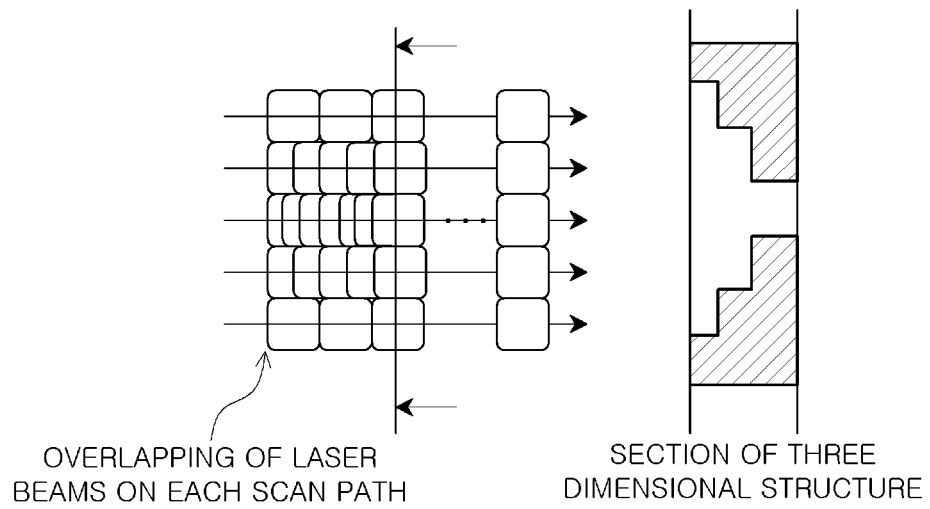

FIG. 17 is a schematic view of controlling the processing depth by the degree of the overlap rate of the laser beam, and shows a method of forming the laser-processed pattern having certain depth by controlling the overlap rate of the laser beam for each scan path.

Second, the processing depth may be set by controlling a number of overlaps of the scan paths. In other words, the processing depth of the laser-processed pattern may be set by controlling an accumulated energy distribution according to a number of movements of the laser beam within the same scan path.

In detail, the relative speed of the laser beam for each scan path and the pulse frequency value are fixed (in other words, the scan pitch is fixed), and the processing depth is set by selectively setting the number of overlaps of the scan path within the unit processing area.

Figure 18:
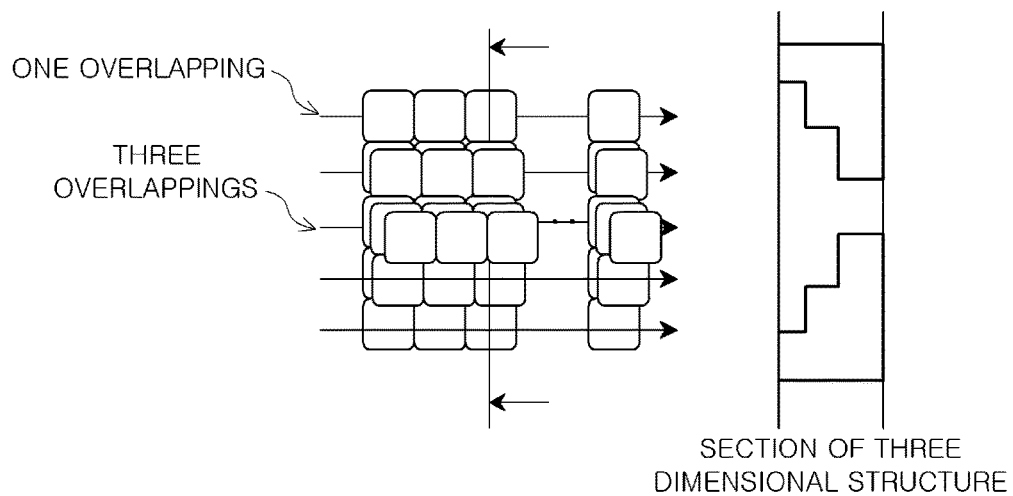

FIG. 18 is a schematic view of controlling the processing depth by the number of overlaps of the scan path, the laser-processed pattern is formed by controlling the number of overlaps of the laser beam for each scan path.

Third, the processing depth may be set by setting intensity of the laser beam for each scan path, by setting intensity of the laser beam for each pulse of the laser beam source within one same scan path, or by setting a combination of the two. In other words, the processing depth of the laser-processed pattern may be set by controlling the accumulated energy distribution of the laser beam according to an adjustment of energy intensity of the laser beam within the same scan path.

In detail, the relative speed of the laser beam for each scan path and the pulse frequency value are fixed (in other words, the scan pitch is fixed), and the energy intensity of the laser beam source is varied for each pulse while the laser beam moves along each scan path, or the energy intensity of the laser beam source is varied for each scan path.

Figure 19:
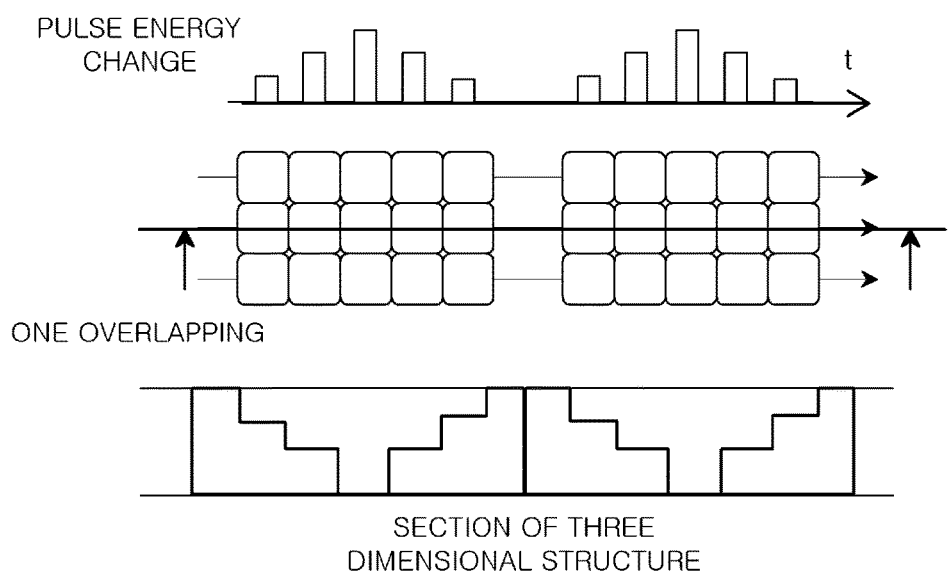

FIG. 19 is a schematic view of controlling the processing depth by varying energy intensity of the laser beam source for each pulse while the laser beam moves along each scan path. The laser-processed pattern having certain depth is formed by controlling the energy intensity of the laser beam source according to each scan path.

In order to set the processing depth, the processing depth may be determined by any one of, or a combination of two or more of, the overlap rate of the laser beam while moving along the scan path, the number of overlaps of the scan paths, and the energy intensity of the laser beam while moving along the scan paths.

Meanwhile, the laser-processed pattern may by formed by setting the first to the $n^{th}$ scan paths (a first direction) and first to $m^{th}$ scan paths (a second direction), the second direction is perpendicular to the first direction).

In order to form such laser-processed pattern, a tapered laser-processed pattern may be formed by setting an accumulated energy distribution by the scan path according to a sequence of intensity of the laser beam. In other words, while the scan path is set in two directions that are perpendicular to each other, the accumulated energy distribution is set by the scan path according to the sequence of intensity of the laser beam such that the processing depth to form the tapered laser-processed pattern is implemented.

Figure 20:
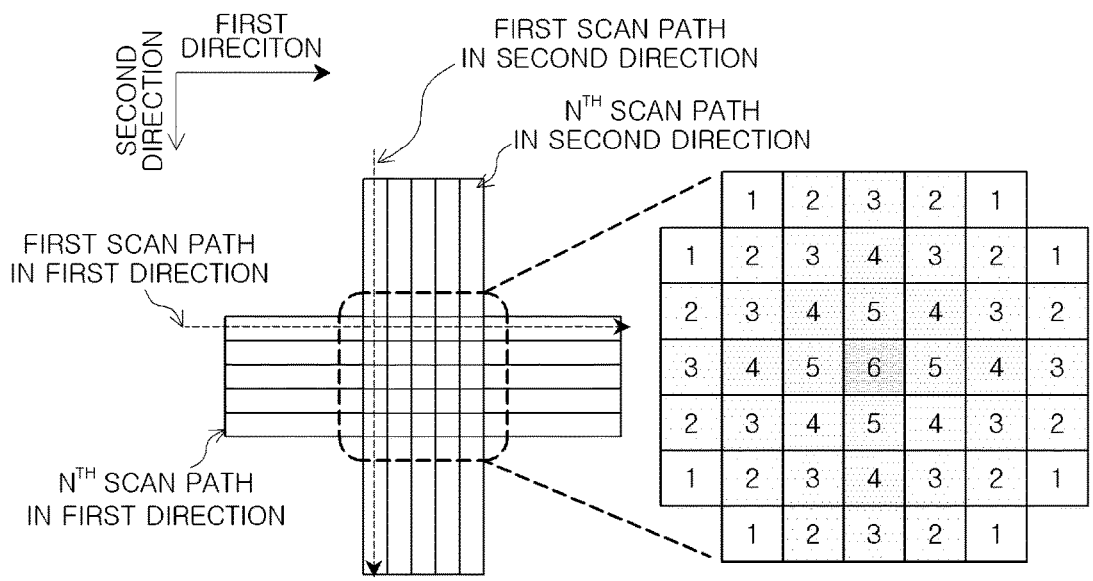

In detail, as shown in FIG. 20, the processing depth of the first scan path of the first direction, the $n^{th}$ scan path of the first direction, the first scan path of the second direction, and the $m^{th}$ scan path of the second direction are set to be identical. Processing depths for the other scan paths are set by using the same method.

For example, the processing depth of the second scan path of the first direction (=the $n-1^{th}$ scan path of the first direction=the second scan path of the second direction=the $m-1^{th}$ scan path of the second direction) is equal to or larger than the processing depth of the first scan path of the first direction (=the $n^{th}$ scan path of the first direction=the first scan path of the second direction=the $m^{th}$ scan path of the second direction). Processing depths for the other scan path are set by using the same method.

In addition, in a method of forming another tapered laser-processed pattern, a plurality of energy areas is set on a laser-processed pattern area within the unit processing area. A processing depth for the tapered laser-processed pattern may be set by setting the accumulated energy distribution by the energy areas according to the sequence of intensity of the laser beam.

In detail, an accumulated energy distribution assigned to a second energy area is equal to or larger than an accumulated energy distribution assigned to a first energy area, and an accumulated energy distribution is set by the energy areas according to the sequence of intensity of the laser beam.

Setting the accumulated energy distribution by the energy areas is performed by setting the number of overlaps of the scan path, or by setting the intensity of the laser beam moving along the scan path.

Figure 21:
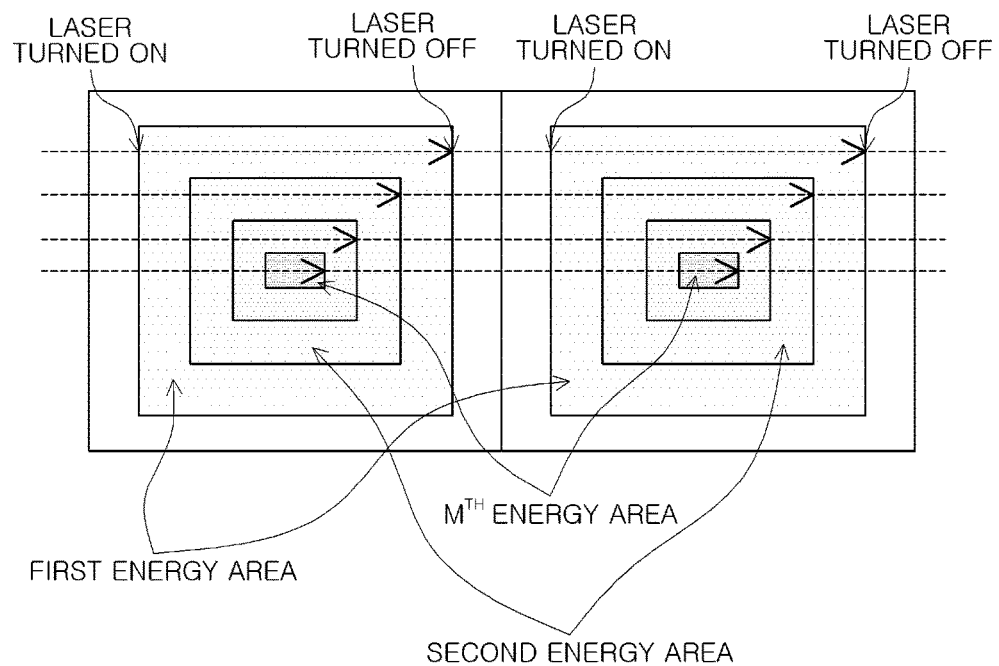

FIG. 21 is a view showing that accumulated energy distributions of the energy areas is controlled by the number of overlaps of the scan path. While the relative speed of the laser beam and values of the pulse frequency and the intensity of the laser beam are fixed, a specific number of overlaps of the scan path is set for an area of a first energy area that is not included in an intersection area between a first energy area and a second energy area.

A number of overlaps of the scan path of an area of the second energy area that is not included in an intersection area between the second energy area and a third energy area, is set to be equal to or larger than the specific number of overlaps of the scan path. The tapered laser-processed pattern is formed by controlling the accumulated energy distribution of the remaining energy areas by using the same method.

Figure 22:
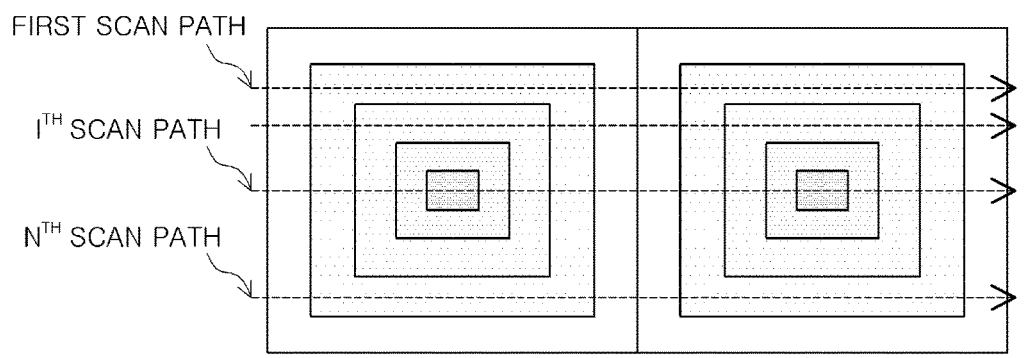
Figure 22:
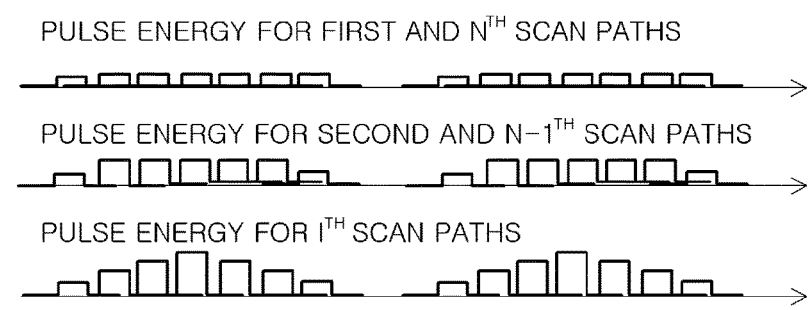
Figure 23:
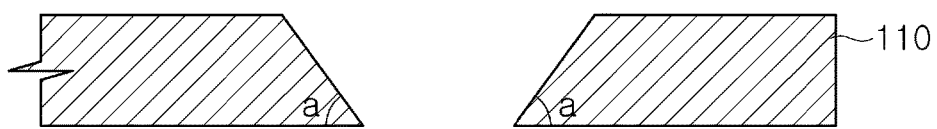
FIG. 23 is a schematic view of a taper angle (a) of an aperture according to an embodiment of the present invention.

FIG. 22 shows a view in which the accumulated energy distribution for each energy area is controlled by an energy intensity change for each pulse of the laser beam source that moves along the scan path. Intensity of the energy pulse for each energy area is set to the same value. In other words, an identical pulse energy wave is set to a first scan path and an $n^{th}$ scan path.

As shown in FIG. 22, compared with a pulse energy wave of a first scan path (=$n^{th}$ scan path), energy intensity for each pulse of a pulse energy wave of a second scan path (=n−1$^{th}$ scan path) is respectively determined by energy areas.

Herein, the accumulated energy distribution by the energy areas according to the sequence of intensity of the laser beam may be set by setting a sequence of the number of overlaps of the scan path, or by setting a sequence of the pulse intensity of the laser beam source that moves along the scan path.

Thus, the present embodiment discloses a method of simply forming the laser-processed pattern by setting the processing depths for the scan paths, and the tapered laser-processed pattern is easily formed by controlling the total accumulated energy distribution for a specific scan path or energy area.

In addition, it is preferable to form the wet-etched pattern up to 50% to 95% of the entire thickness of the base and to form the laser-processed pattern to the remaining 5% to 50% of the thickness. Thus, productivity degradation of the conventional laser processing method is solved. Thickness adjustment for wet etching and laser processing is determined by considering performance and productivity of wet etching and laser processing.

In addition, the laser-processed pattern formed by laser processing has burrs on a back surface thereof, the burrs protruding from the back surface to heights equal to or less than 1 μm such that glass damage while depositing the organic materials may be minimized. Burrs are minimized since the shadow mask is manufactured with a low energy by implementing both wet etching and laser processing.

In addition, when the laser-processed pattern is tapered in which the inner diameter reduces from a laser-processing surface, it is preferable to form a taper angle to be set to a range from 30 degrees to 90 degrees.

In conventional wet etching, it was impossible to implement the taper angle in a specific angle due to the isotropic characteristic of wet etching. However, when laser processing is performed after performing the wet-etched pattern, then it is possible to implement the taper angle of the aperture (a in FIG. 23) to be greater than 0 degrees and equal to or less than 90 degrees by adjusting intensity of the laser beam for each area.

However, the taper angle A of the aperture may be varied according to the thickness of the metal material, arrangement shape and size of aperture pattern considering physical hardness of the aperture of the metal mask and shadow effect while depositing the organic materials. It is preferable that the taper angle A ranges from 30 degrees to 90 degrees.

In other words, by using hybrid processing of the present invention, it is possible to implement a metal mask having a taper angle while securing sufficient productivity applicable to industrial sites, and to ensure quality of the surface of the metal mask after the processing.

Figure 1:
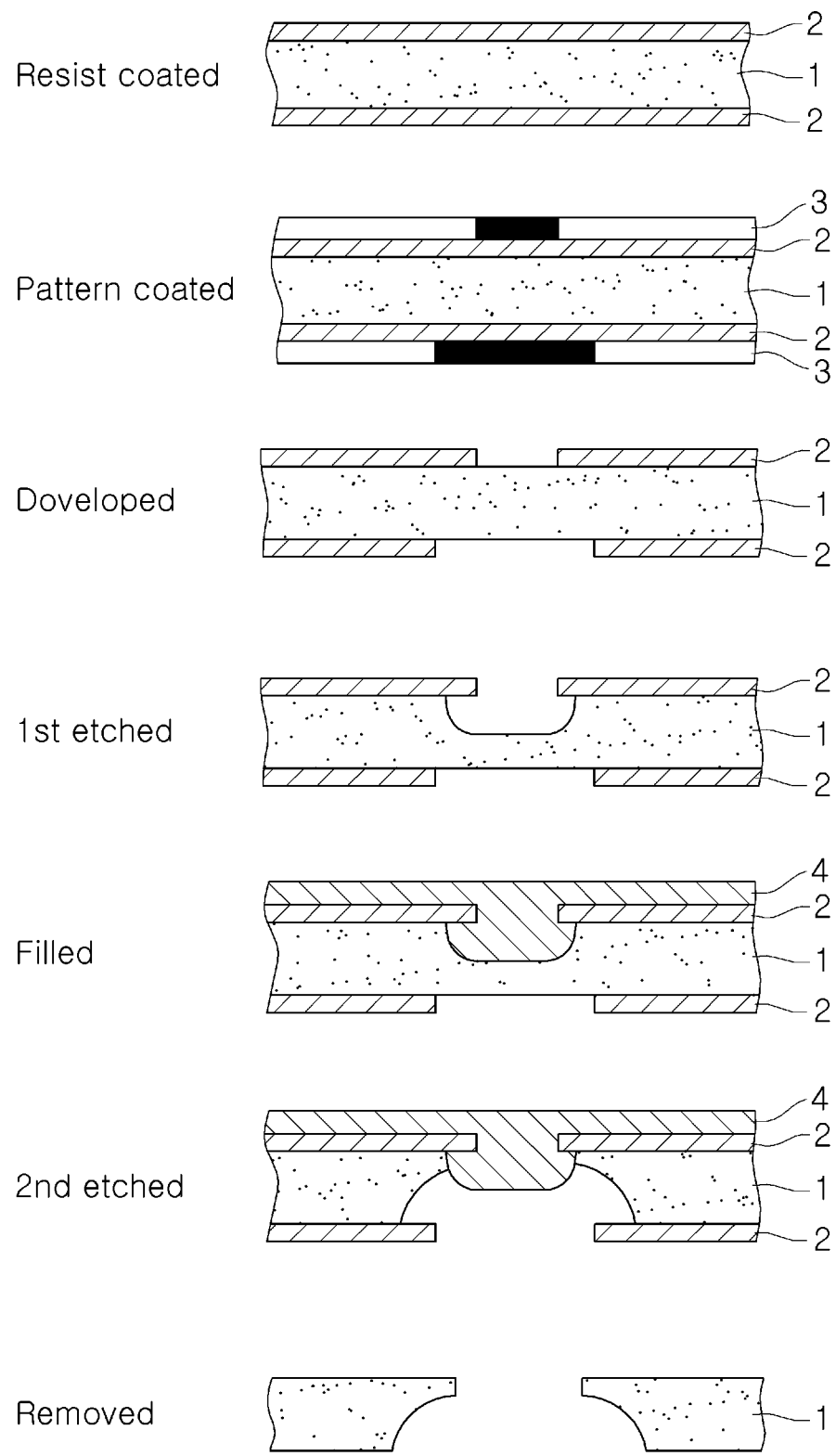
FIG. 1 is a schematic view of a method of manufacturing a shadow mask according to conventional chemical wet etching.
Figure 2:
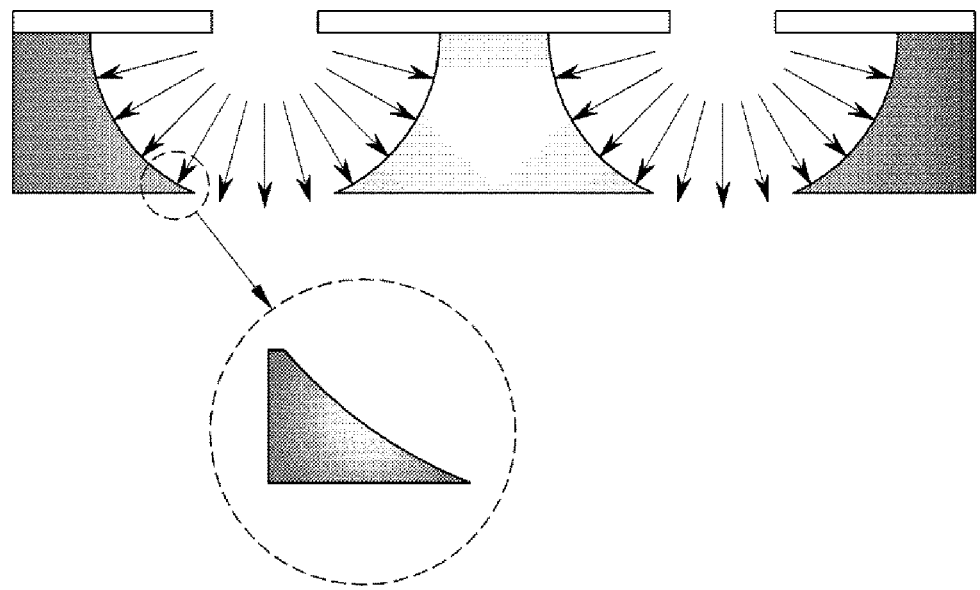
FIG. 2 is a schematic view of a shadow mask manufactured by conventional chemical wet etching.
Figure 3:
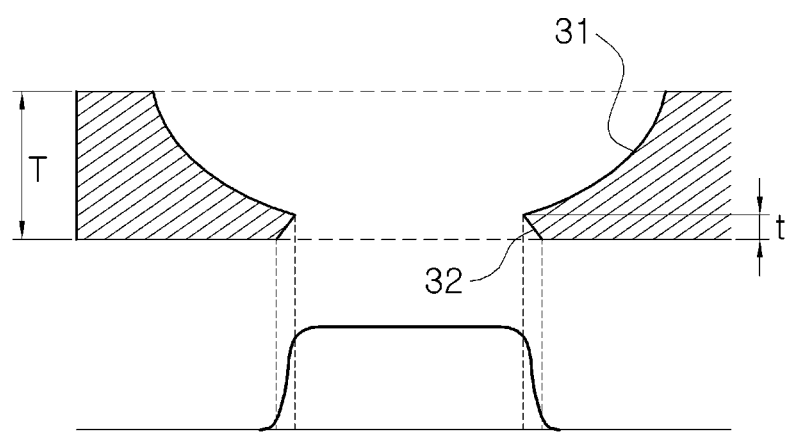
FIG. 3 is a schematic view of a shadow mask manufactured by conventional double-sided wet etching.
Figure 4:
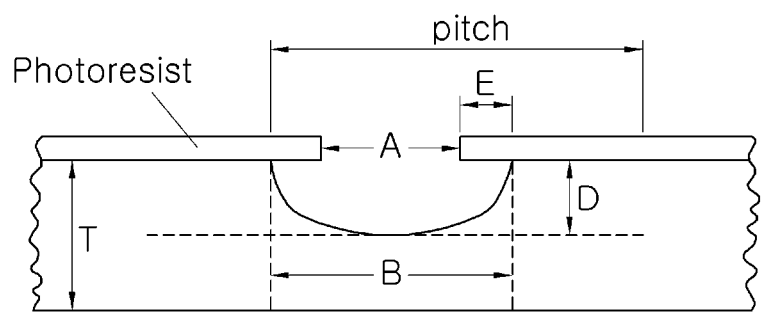
FIG. 4 is a view of explaining an isotropic shape of conventional wet etching (explaining formulas of (1), (2), and (3) showing correlations between factors of the shape (A, B, D, E, T, pitch, and Etch factor)).
Figure 5:
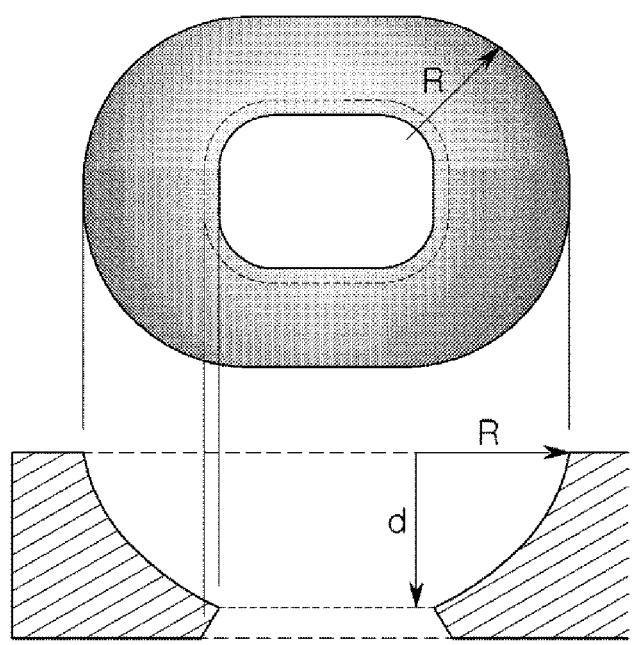
FIG. 5 is a view showing the isotropic shape drawn in a top plan view of conventional wet etching.
Figure 6:
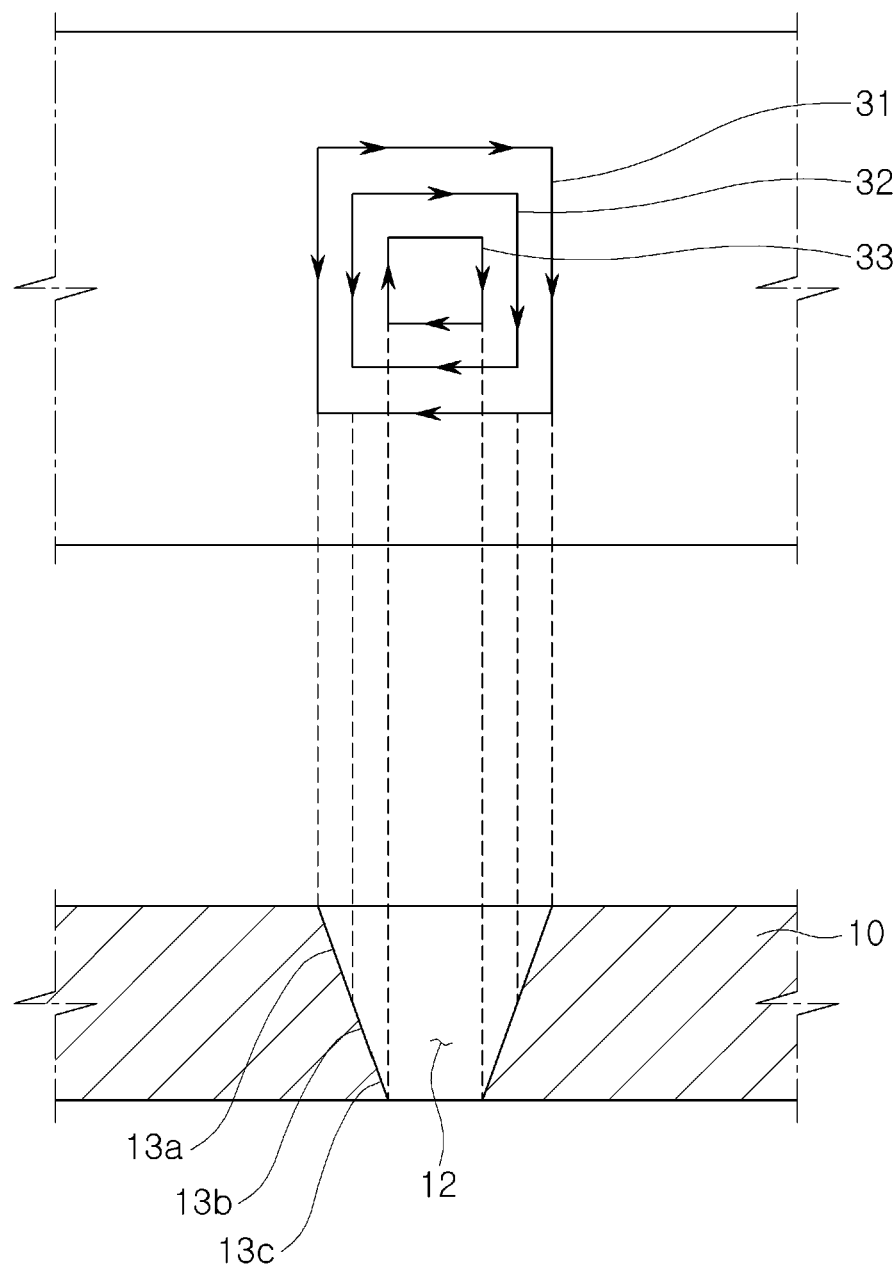
FIG. 6 is a schematic view of a method of manufacturing a shadow mask by conventional laser processing.
Figure 7:
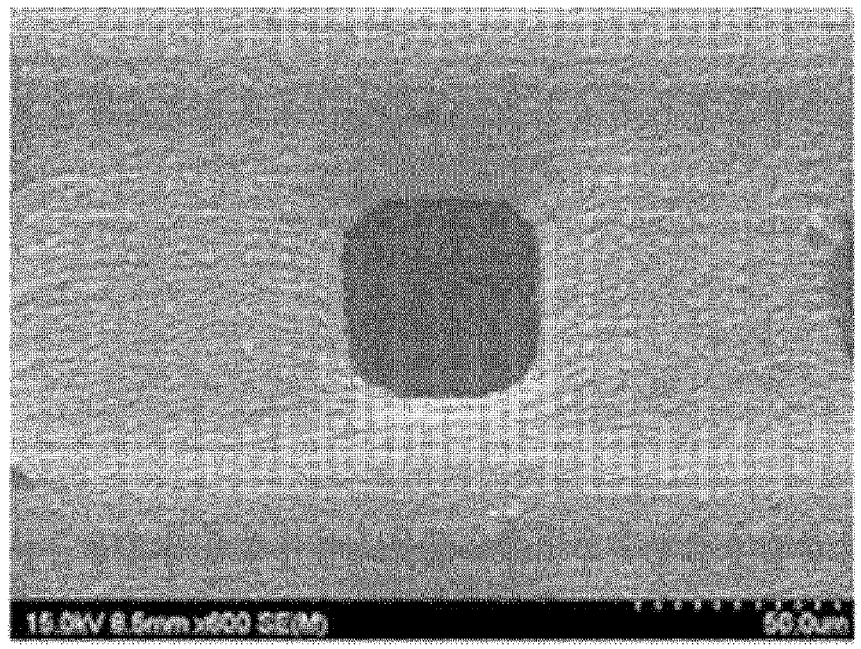
FIG. 7 is a view showing a photo of a shadow mask formed by using conventional laser processing.

In addition, as shown in FIG. 5, the aperture shape implemented by performing wet etching has rounded edges (wet-etched surface of wet-etched pattern) in the top plan view and has a bowl shape in the cross sectional view. When hybrid processing of the present invention is used, the laser-processed pattern is performed by laser processing after forming the wet-etched pattern by wet etching, and an amount of processing of laser processing and wet etching is properly adjusted, and thus a radius of curvature R of a surface of the wet-etched pattern and a depth d of the bowl shape may be adjusted.

For example, when the amount of wet etching is set to be large and the amount of laser processing is set to be small, processing time of laser processing may be reduced since the amount of laser processing is small, however, the radius of curvature R of the surface of the wet-etched pattern is increased and the depth d of the bowl shape is deepen (d is increased). Alternatively, when the amount of wet etching is set to be small and the amount of laser processing is set to be large, processing time of laser processing may be relatively increased, however, the radius of curvature R of the surface of the wet-etched pattern and the depth d of the bowl shape is reduced, thus a linearity of the taper structure is increased.

The method of manufacturing a shadow mask according the present invention performs wet etching to form the aperture of the shadow mask while forming the wet-etched pattern, and performs laser processing to form the laser-processed pattern by continuously irradiating the laser beam onto the wet-etched pattern. An approximate shape of the shadow mask is formed by wet etching.

An amount of the metal material to be additionally removed by laser processing is very small. Accordingly, a number of laser pulses to be applied to the metal material are reduced and a thermal accumulation effect of the conventional method (method of laser-processing the entire metal mask by using the laser) is also remarkably reduced. Therefore, there is an effect of providing a shadow mask with high quality.

Accordingly, the method of manufacturing the shadow mask of the present invention uses both wet etching and laser processing to solve productivity degradation of conventional laser processing and provides high quality of the shadow mask through wet etching.

In addition, the undercut problem caused by the isotropic characteristic of wet etching is solved by using hybrid processing including wet etching and laser processing. Accordingly, the gradual deposition of the electroluminescence material that is deposited on the substrate is prevented, boundary parts of the deposited electroluminescence material become clear, and thus performance of the display device is improved.

Also, factors of the shape that are used for forming the mask pattern are not restricted to their limitations by using hybrid processing including wet etching and laser processing, and thus the shadow mask of the present invention is used for implementing display devices having resolutions of QHD (approximately 500 ppi) or UDH (approximately 800 ppi).

The invention claimed is:

1. A method of manufacturing a shadow mask, wherein hybrid processing is used to form a mask pattern on the shadow mask, the method comprising:
   forming a wet-etched pattern by performing wet etching from above a base;
   forming a laser-processed pattern that continues from the wet-etched pattern, by performing laser processing from above the base or from below the base on which the wet-etched pattern is formed,
   wherein at the forming the laser-processed pattern, a masking part having a masking pattern corresponding to the mask pattern of the shadow mask is formed above an upper surface of the base, and a laser beam is irradiated from above the masking part,
   wherein the masking part is a phase shift mask (PSM) that has a plurality of masking patterns having different widths and being capable of shifting a phase of the laser beam at different angles,
   wherein when irradiating the laser beam from above the masking part, the laser beam is irradiated from above the phase shift mask (PSM) onto the base to pass through the masking patterns that shift the phase of the laser beam.

2. The method of claim 1, wherein the masking pattern of the masking part is formed above the upper surface of the base by a photoresist formed through a photolithography process,
wherein when irradiating the laser beam from above the masking part,
the laser beam is irradiated onto a photoresist-removed area of the masking pattern of the masking part.

3. The method of claim 1, wherein the forming the laser-processed pattern comprises:
a first step of setting a unit processing area on the base;
a second step of performing laser processing to form a part of the laser-processed pattern within the unit processing area while moving the laser beam along a first scan path from a first boundary to a second boundary of the unit processing area;
a third step of turning the laser beam to a next direction, moving the laser beam by a step pitch, and performing laser processing to form another part of the laser-processed pattern within the unit processing area while moving the laser beam along a second scan path; and
a fourth step of repeating the second and third steps until finishing laser processing while moving the laser beam along an nth scan path, thereby completing laser processing over an entire area of the unit processing area.

4. The method of claim 3, wherein the forming the laser-processed pattern further comprises:
setting a processing depth for each of the scan paths.

5. The method of claim 3, wherein the forming the laser-processed pattern further comprises:
setting a plurality of energy areas on a laser-processed pattern area within the unit processing area; and
setting a processing depth for each of the energy areas by setting an accumulated energy distribution by the energy areas according to a sequence of intensity of the laser beam.

6. The method of claim 1, wherein the laser-processed pattern formed by laser processing has an inner diameter that is gradually reduced in a direction from a laser-processed surface.

7. The method of claim 1, wherein the forming the wet-etched pattern comprises:
forming a photoresist pattern on an upper surface of the base to form the wet-etched pattern, and performing wet etching on the base along a photoresist-removed area.

8. The method of claim 1, wherein at the forming the laser-processed pattern, laser processing is performed in a direction same as or opposite to a wet etching direction.

9. The method of claim 8, wherein the laser-processed pattern formed by laser processing is formed in the direction same as or opposite to the wet etching direction to continues from the wet-etched pattern.

10. The method of claim 1, wherein the wet-etched pattern is formed by wet etching up to 50% to 95% of an entire thickness of the base, and the laser-processed pattern is formed by laser processing to a remaining thickness of the base.

11. The method of claim 1, wherein when the laser-processed pattern is tapered by gradually reducing an inner diameter thereof in a direction from a laser-processed surface, a tapered angle of the laser-processed pattern is set to a range from 30 degrees to 90 degrees.

12. The method of claim 1, wherein the laser-processed pattern formed by laser processing has burrs on a back surface thereof, the burrs protruding from the back surface to heights equal to or less than 1 μm.

13. A method of manufacturing a shadow mask, wherein hybrid processing is used to form a mask pattern on the shadow mask, the method comprising:
forming a wet-etched pattern by performing wet etching from above a base;
forming a laser-processed pattern that continues from the wet-etched pattern, by performing laser processing from above the base or from below the base on which the wet-etched pattern is formed,
wherein at the forming the laser-processed pattern, a masking part having a masking pattern corresponding to the mask pattern of the shadow mask is formed above an upper surface of the base, and a laser beam is irradiated from above the masking part,
wherein the masking part includes a body through which the laser beam passes, and a slit-shaped masking pattern formed on an upper surface of the body, the masking pattern including a plurality of laser blocking parts separated from each other in a width direction of the body and a plurality of laser transmitting parts that are spaces defined between the laser blocking parts and transmit the laser beam therethrough,
wherein the slit-shaped masking pattern is configured such that widths of the laser blocking parts become narrower in a direction from an exterior to a center of the body and widths of the laser transmitting parts become wider in the direction from the exterior to the center of the body,
wherein when irradiating the laser beam from above the masking part,
the laser beam is irradiated from above the slit-shaped masking pattern of the masking part such that intensity of the laser beam irradiated onto the base at a portion corresponding to a laser transmitting part having a relatively wider width is higher than intensity of the laser beam irradiated onto the base at a portion corresponding to a laser transmitting part having a relatively narrower width.

14. A shadow mask manufactured by the method of claim 1.

15. A shadow mask manufactured by the method of claim 13.

16. A shadow mask manufactured by the method of claim 3.

* * * * *